United States Patent [19]
Finch et al.

[11] Patent Number: 5,909,192
[45] Date of Patent: Jun. 1, 1999

[54] METHOD OF DISPLAYING GRAPHS WITH MARKERS

[75] Inventors: David Peter Finch; Donald Anthony Bradley, both of Morgan Hill, Calif.

[73] Assignee: Wiltron Company, Morgan Hill, Calif.

[21] Appl. No.: 07/176,097

[22] Filed: Mar. 31, 1988

[51] Int. Cl.$^6$ ..................................................... G01S 13/00
[52] U.S. Cl. ............................................................ 342/182
[58] Field of Search .................................... 364/188, 518, 364/521; 342/182

[56] References Cited

U.S. PATENT DOCUMENTS 4,570,217  2/1986  ALlew et al. .......................... 364/188

*Primary Examiner*—Salvatore Cangialosi
*Attorney, Agent, or Firm*—Fliesler, Dubb, Meyer & Lovejoy, LLP.

[57] ABSTRACT

A graph of data samples in a graph field on the display, including a first coordinate axis, a second coordinate axis, a trace indicating characteristics of data samples with respect to the coordinate axes, and a plurality of markers indicating positions of respective data samples along the trace is displayed. The markers appear on the display in the form of a symbol and a marker annotation field and are positioned within the graph field adjacent the data sample to which they are tied. The positions of the marker fields of the plurality of markers are calculated according to a preferred orientation with respect to the trace and their respective data samples. Markers are identified for which the marker annotation field according to the calculated position, lie in whole or in part outside the graph field, or for which the marker annotation field overlaps a marker field of another marker in the plurality of markers. The position of each marker identified as lying in whole or in part outside the graph field is recalculated according to a second orientation with respect to the trace, and the position of each marker identified as overlapping with the marker field of another marker is recalculated so that it no longer overlaps with such marker field.

16 Claims, 18 Drawing Sheets

START: 0.5000 GHGz
STOP: 18.0000 GHz
STEP: 105.0 MHz

| ▷ MARKER 1 ON<br>3.3350 GHz | MARKER 4 ON<br>13.8350 GHz |
|---|---|
| MARKER 2 ON<br>6.0650 GHz | MARKER 5 ON<br>1.5500 GHz |
| MARKER 3 ON<br>10.4750 GHz | MARKER 6 ON<br>15.6200 GHz |

METHOD OF DISPLAYING GRAPHS WITH MARKERS

CROSS-REFERENCE TO RELATED APPLICATION

U.S. Patent Application entitled MICROWAVE MEASUREMENT SYSTEM AND ASSOCIATED METHOD, invented by Martin I. Grace et al., filed on the same date as the present application, and owned currently and at the time of invention by a common assignee, is incorporated by reference.

BACKGROUND OF THE INVENTION

1. Field of the Invention

The present invention relates to methods for displaying graphs illustrating a trace of data samples with respect to coordinate axes and, particularly, to displaying markers on the graphs identifying data samples having a particular value along the trace.

2. Description of Related Art

Electronic system analyzers such as the WILTRON 360 Network Analyzer manufactured by Wiltron Company, 490 Jarvis Drive, Morgan Hill, Calif., are used by system designers and trouble-shooters to measure characteristics of subject systems. Measured characteristics can be compared with expected characteristics to identify problems in subject systems. Often, the measured system characteristics can best be presented to the operator of the system analyzer in graph form. For instance, in the WILTRON 360, which is used with microwave frequency electronic networks, provides the user with the option to display the measured information about transmission and reflection characteristics of the networks in a variety of graphical forms, such as rectilinear phase versus frequency and magnitude versus frequency graphs, or in polar or Smith chart formats.

Often it is useful for an operator to display markers along a trace on a graph identifying samples of interest. As the operator changes scales on the graph or form of graph, the markers are automatically positioned in the proper location so that the operator can keep track of the samples of interest. When a large number of markers appears on a graph or the markers begin to crowd the edges of the field of the graph on the display, information provided by the crowded markers may be lost because of overwriting of the marker symbols. Accordingly, there is a need for an algorithm for displaying markers that overcomes the problems of crowded displays.

SUMMARY OF THE INVENTION

The present invention provides a method for displaying a plurality of markers for use with a data processing system including a display. This display displays a graph of data samples in a graph field. The graph includes a first coordinate axis, a second coordinate axis and a trace indicating characteristics of data samples with respect to the coordinate axes. The plurality of markers indicates positions of respective data samples along the trace and appears on the display in the form of annotation within a marker field that is positioned within the graph field adjacent the data sample to which it is tied. The method comprises steps of calculating the positions of the marker fields of the plurality of markers according to a preferred orientation with respect to the trace and the respective data samples; identifying markers for which the marker field according to the calculated position, lies in whole or in part outside the graph field, or overlaps a marker field of another marker in the plurality of markers; and recalculating the position of each marker identified as lying in whole or in part outside the graph field according to a second orientation with respect to the trace, and of each marker identified as overlapping with the marker field of another marker so that it no longer overlaps with such marker field.

According to another aspect of the present invention, the method further includes a step of positioning the recalculated marker fields so that they are as nearly centered over their respective data samples as possible.

According to yet another aspect, the present invention is an apparatus for displaying data that is operable according to the methods summarized above.

For complicated network analyzers, the amount of information displayed on a display screen to an operator is quite large. Accordingly, it is necessary to present that information in a form that is readily understandable by the operator. Accordingly, the method for displaying markers according to the present invention adds significantly to the overall clarity of a display of complicated information.

DESCRIPTION OF THE PREFERRED EMBODIMENT

With reference to the figures, a detailed description of a preferred embodiment of the present invention is provided. The results of the display method according to the present invention are described with reference to FIGS. 1 through 5. A detailed description of a software implementation of the display method is described with reference to FIGS. 6 through 15.

Figure 1:
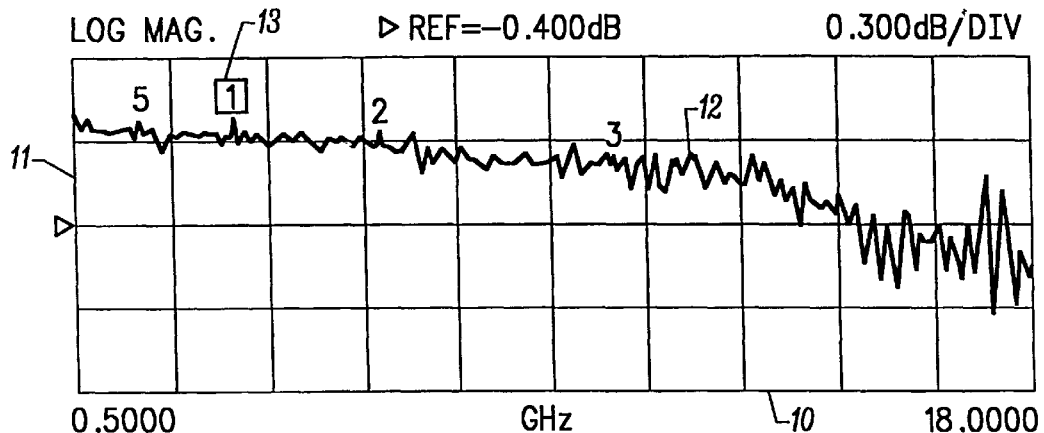
FIG. 1 is an illustration of a graph with markers displayed according to the preferred orientation.
Figure 2:
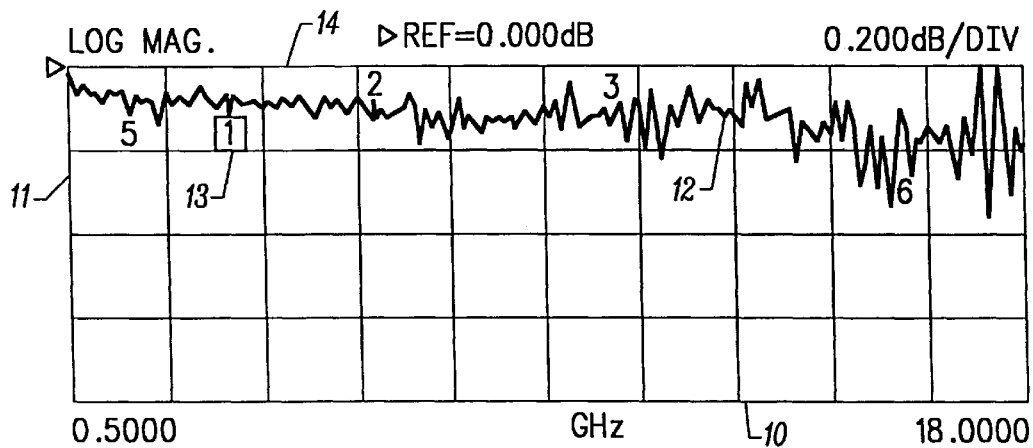
FIG. 2 is an illustration of a graph corresponding to the graph of FIG. 1 with the scale changed and some of the markers displayed according to a second orientation, so that the marker symbols do not overlap the edge of the graph field.
Figure 3A:
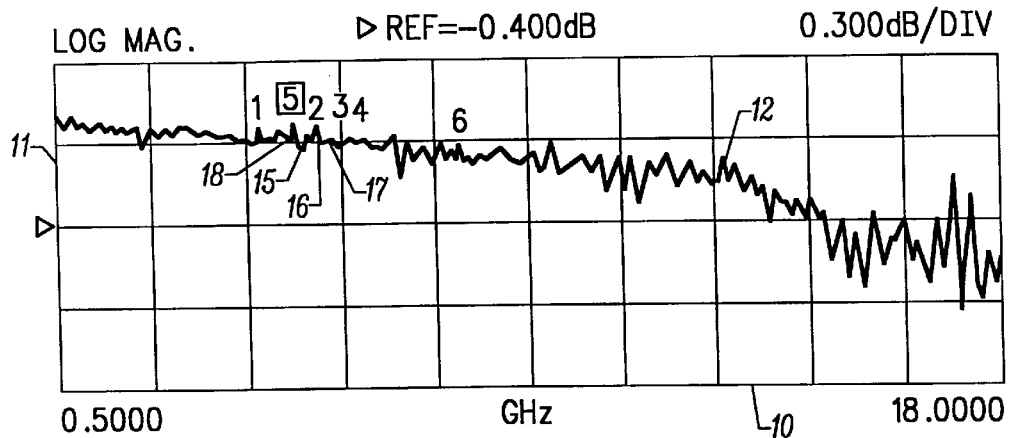
FIG. 3A is an illustration of a graph where marker numbers 2, 3 and 4 are positioned off-center from their respective marker symbols to make room for active marker, number 5.
Figure 3B:
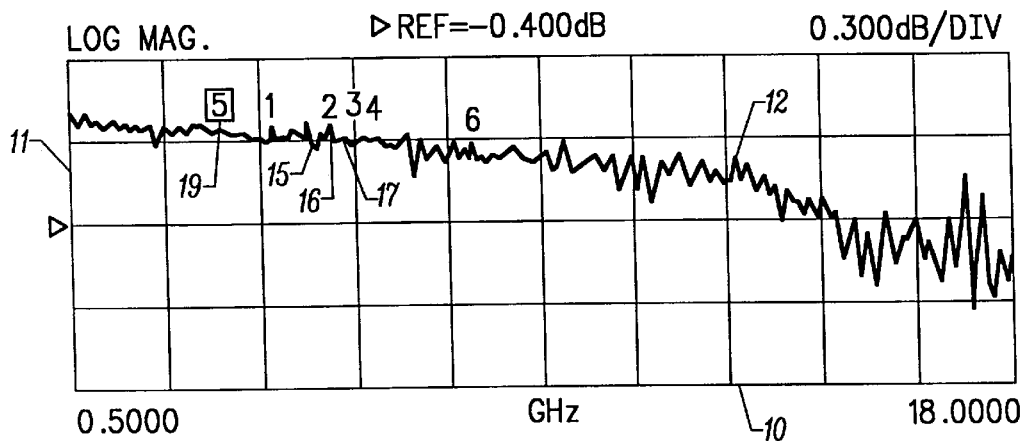
FIG. 3B illustrates the graph of FIG. 3A, with marker annotations 2, 3 and 4 off-center from their respective marker symbols after active marker number 5 has been moved.
Figure 4:
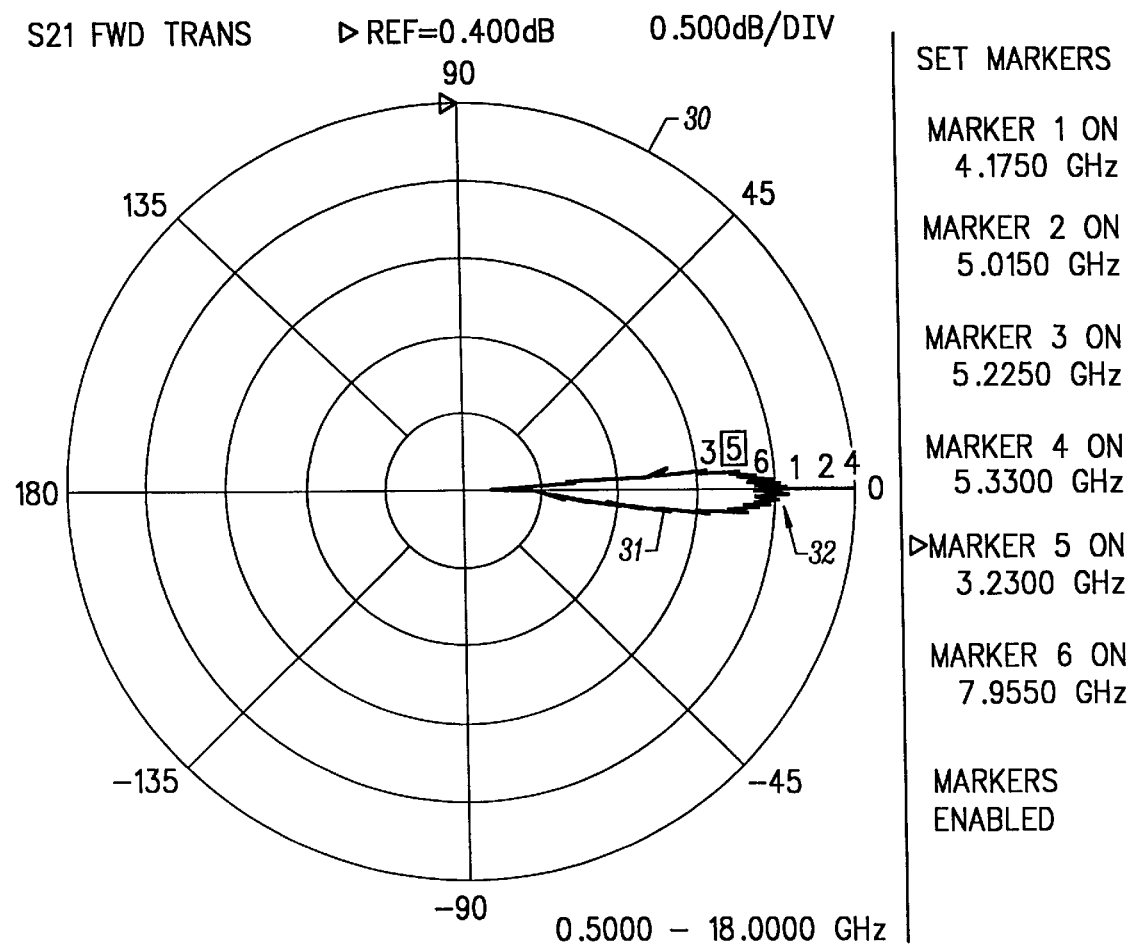
FIG. 4 illustrates a polar graph implementing the present invention.
Figure 5:
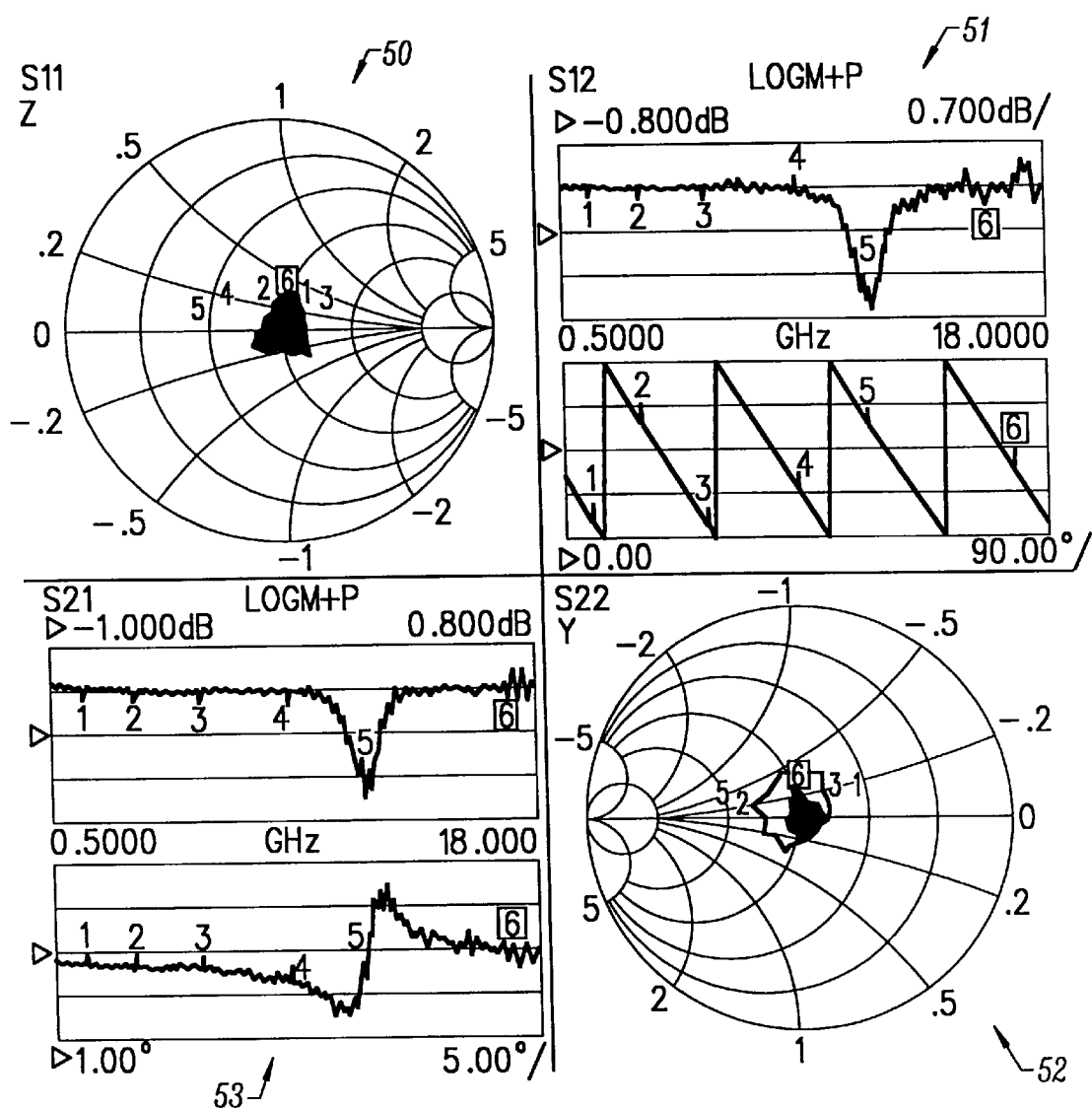
FIG. 5 illustrates a display having a plurality of graph fields with markers displayed on each of the fields.

The method of displaying markers according to the present invention, addresses the problem of markers which overlap with the edge of the graph field on a display, of markers which are crowded along a trace such that the position of the annotation associated with each marker must be adjusted from a preferred orientation, and for arranging crowded markers in a manner that is understandable to the operator. FIGS. 1 and 2 illustrate the operation of the present invention for markers that would overlap with the boundary of the graph field in a preferred orientation and are therefore re-oriented. FIGS. 3A and 3B illustrate the problem of crowded markers. FIG. 4 shows application of the invention to non-rectilinear graphs and FIG. 5 illustrates the use of the present invention on a system displaying a plurality of graphs of a variety of types on a single display.

FIGS. 1 and 2 are graphs of the forward transmission characteristic known as S21, for a frequency sweep starting at 0.5000 GHz, and ending at 18.0000 GHz in steps of 105.0 MHz. As can be seen, the graph includes first coordinate axis 10 in units of GHz and a second coordinate axis 11 in units of logarithm of the magnitude of the forward transmission characteristic. The graph further includes a trace 12 indicating the characteristics of the data samples with respect to the coordinate axes. Positioned along the trace 12 are a plurality of markers with annotations 1 through 6 at corresponding data samples.

As can be seen at the bottom of FIG. 2, marker 1 is positioned on the data sample at 3.3350 GHz, marker 2 is positioned on the data sample at 6.0650 GHz, marker 3 is positioned on the data sample at 10.4750 GHz, marker 4 is positioned on the data sample at 13.8350 GHz, marker 5 is positioned on the data sample at 1.5500 Ghz and marker 6 is positioned on the data sample at 15.6200 GHz. In the graph of FIG. 1 and 2, a box 13 is placed around a so-called active marker, marker 1 in this instance. The active marker is a marker that is being manipulated by a user of the data processing system generating the display. This display is generated by a WILTRON system 360.

All of the markers in FIG. 1 are oriented so that the annotation for each marker is positioned above the trace 12. This is a preferred orientation for the WILTRON 360. Obviously in other systems, the preferred orientation may provide for the markers to appear below the trace or have other spatial characteristics.

Each of the annotations above the marker are a rectangular bit field for display at a calculated position on the graph field with respect to the trace and the position of their respective data samples. The preferred embodiment is a digital bit map display system. Obviously equivalent systems could use other display formats such that the annotation associated with each marker may take on other characteristics. Nonetheless each annotation has a known size.

Thus as the trace is drawn, the position of each marker field which contains the annotation information is calculated according to its preferred orientation.

If the calculated position of a marker field according to the preferred orientation, overlaps with a boundary of the display, the position of the marker field is recalculated according to a second orientation as illustrated in FIG. 2. FIG. 2 is a graph of the same forward transmission characteristic which is displayed in FIG. 1, except that the scale of the log-magnitude axis has been changed from 0.3 dB per division to 0.2 dB per division and the reference position has been shifted up. This moves the trace 12 close to the upper boundary 14 of the graph field. The first calculated position of the marker fields for markers 1 and 5 according to the preferred orientation, would overlap with the upper boundary 14 of the graph field. Therefore, the positions of these marker fields 1 and 5 are recalculated so that they appear below the trace 12, while marker fields for markers 2, 3, 4 and 6 remain above the trace 12.

Figure 3C:
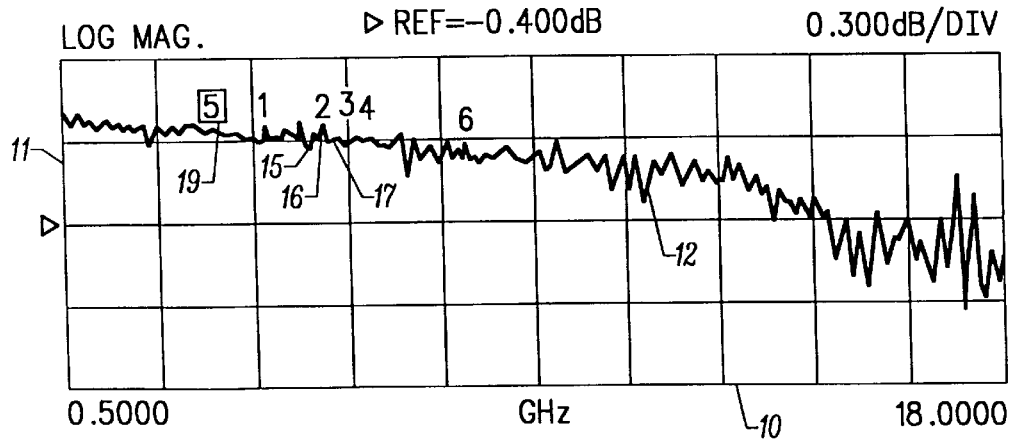
FIG. 3C illustrates the graph of FIG. 3A, with the annotation for markers 2, 3, and 4 re-centered, according to the present invention.

FIGS. 3A–3C illustrate the problem of crowded markers and a manner in which they are positioned according to the present invention. FIG. 3A is a log-magnitude graph of a forward transmission characteristic with markers 1 through 6 positioned along the trace 12. As can be seen in FIG. 3A, the marker fields containing the annotation for markers 2, 3 and 4 are shifted away from their respective data samples 15, 16 and 17 on the display in order to make room for active marker number 5 at data sample 18. However, they are not overlapping. This occurs because the software calculates the position of each marker field so that the annotations do not overlap. FIG. 3B shows markers 2, 3, and 4 still shifted from their preferred positions after the active marker number 5 has been moved to a new data sample 19. The annotations for markers 2, 3, and 4 must be repositioned so that they correspond more closely with the actual positions of their data samples as illustrated in FIG. 3C. As can be seen, in FIG. 3C, the positions of the marker fields have been as closely centered over the respective data points 15, 16 and 17 as possible without causing overlapping of the annotations. However, the user of the system is able to discern which marker corresponds to which annotation.

FIG. 4 illustrates the application of the present invention on a polar coordinate graph 30. As can be seen, the graph includes a trace 31 which displays the amplitude and phase of the forward transmission parameter for a sweep. The markers are set at the data samples corresponding to frequencies indicated in the figure. The figure illustrates that even when the markers are all crowded in the vicinity 32 on the graph, the algorithm is able to position the markers 1 through 6 in a readable manner so that they remain usable to the operator.

FIG. 5 illustrates a multiple graph display which could be generated by a data processing system according to the present invention. As can be seen, a first display field includes a Smith chart 50, a second display field includes a log-magnitude and phase versus frequency chart 51, a third field displays an admittance chart 52 and a fourth field displays a log-magnitude and phase graph 53. The first field displays the Sil reflection parameter measured by the WILTRON 360 system. The second field 51 displays the S12 reverse transmission parameter. The field 52 displays the S22 reflection parameter and the field 53 displays the S21 forward transmission parameter as measured by the WILTRON 360 system. Each of the graphs in fields 51 through 53 is termed a channel in the flowcharts following.

As can be seen, the markers are automatically positioned in each channel according to the present invention, attempting to maintain the preferred orientation of each marker field for each individual channel.

In addition, in the preferred embodiment, the marker annotations are all displayed in a different color than the trace and the grid defining the units of the coordinate axes. In particular, the grid is displayed in green, the trace is displayed in red and the markers are displayed in blue. This further enhances the readability of the display for the operator. The system further includes the ability to display a stored trace in addition to the normal trace. The stored trace is displayed in a color different from the normal trace, e.g., green. In addition, limit lines may be displayed in a pre-specified color on the graph.

FIGS. 6 through 16 illustrate in detail a software implementation of a marker display algorithm according to the present invention.

Figure 6:
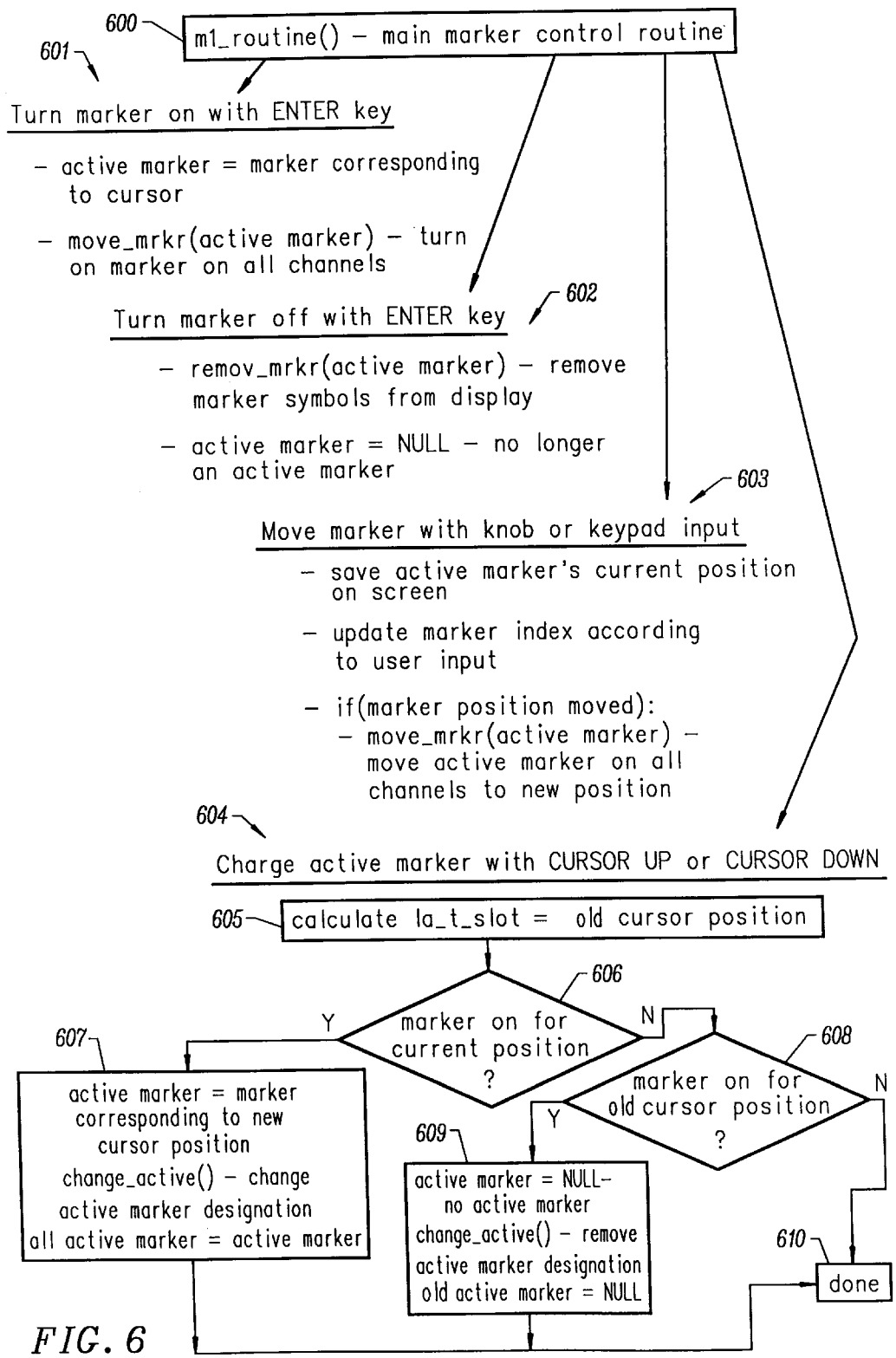
FIG. 6 illustrates the main marker control routine according to the present invention.
Figure 8:
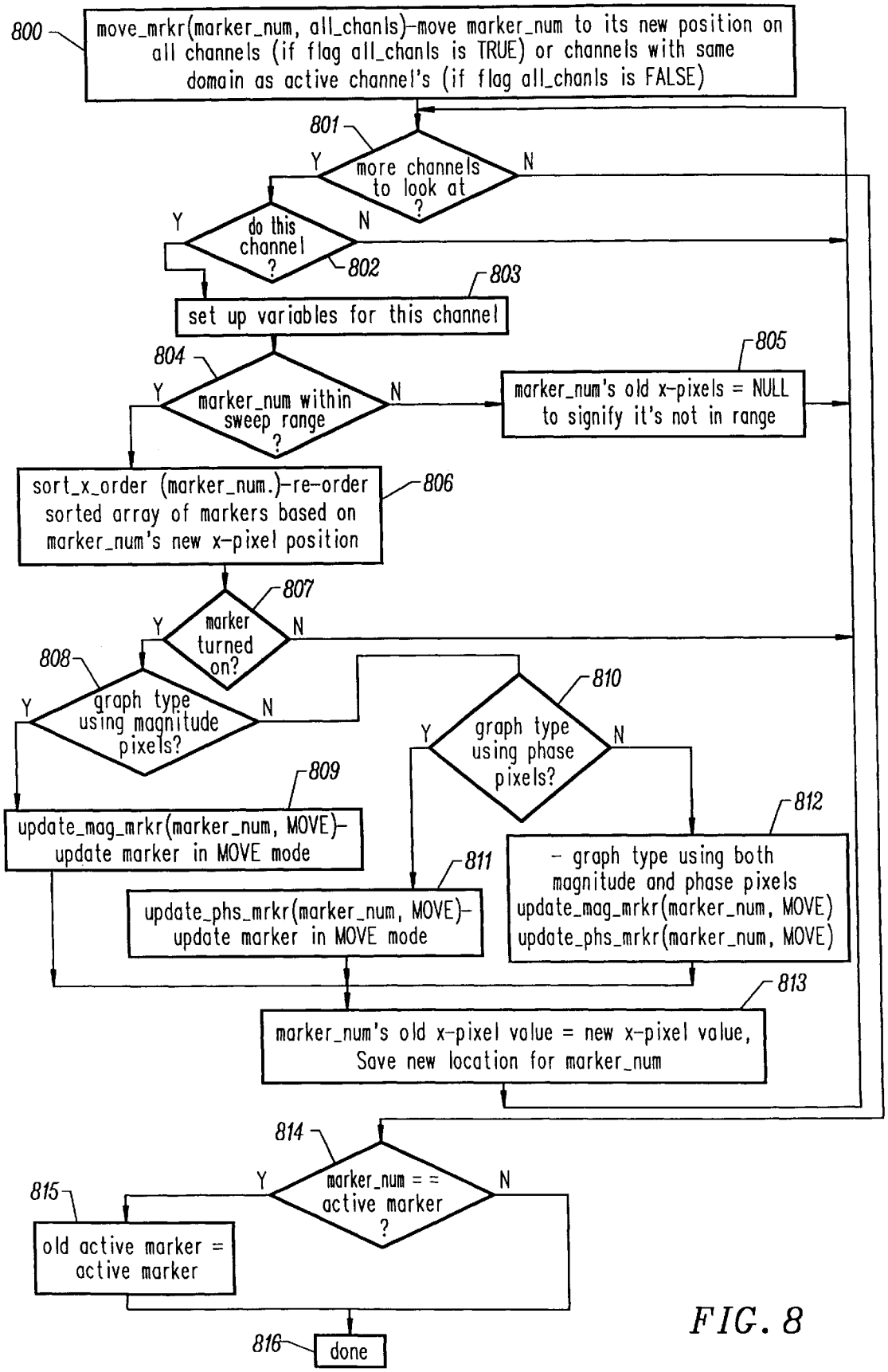
FIG. 8 illustrates the control routine for changing the data sample with which a marker is associated, termed "moving a marker."

FIG. 6 displays the main marker control routine designated "m1-routine( )" (block 600). In the main marker control routine illustrated in FIG. 6, there are four basic functions. The first function 601 turns on markers and indicates an active marker in response to keyboard input. This sets the active marker as the marker corresponding to a cursor position on the screen. Further, the active marker is turned on for all channels by calling the move_mrkr routine (FIG. 8).

The second function 602 turns the markers off with keyboard input. A designated active marker is removed using the remov_mrkr routine (FIG. 10) and the active marker is set to the NULL value indicating that there is no longer an active marker.

The third function 603 moves a marker using a knob or keyboard input. This algorithm involves saving the active marker's current position on the screen, updating a marker index (i.e., data sample), according to the user input and if the marker's position is moved, then calling the move_mrkr (active marker) routine (FIG. 8) to move the active marker on all channels to the new position.

The fourth function 604 changes the active marker. This algorithm involves calculating the last_slot which is equal to the old cursor position (block 605). From there, it is determined whether the marker is on for the current position of the cursor (block 606). If the marker is on, the active marker is set as the marker corresponding to the new cursor position, by calling the change_active( ) routine (FIG. 9) and setting the old active marker to the active marker (block 607). If in block 607, the marker is not on for the current position, it is determined whether the marker is on from the old cursor position in block 608. If the marker is on, the active marker is set to the null value, by calling the change_active( ) routine and the old active marker is set to the NULL value (block 609). If the marker is not on for the old cursor position in the test of block 608, or after blocks 607 or 609, then the algorithm is done (block 610).

FIG. 6 illustrates algorithms for managing which marker is designated the active marker by use of the rectangle 13 described with reference to FIGS. 1A and 1B, for changing the data sample with which a marker is associated, and for turning markers on and off.

Figure 7:
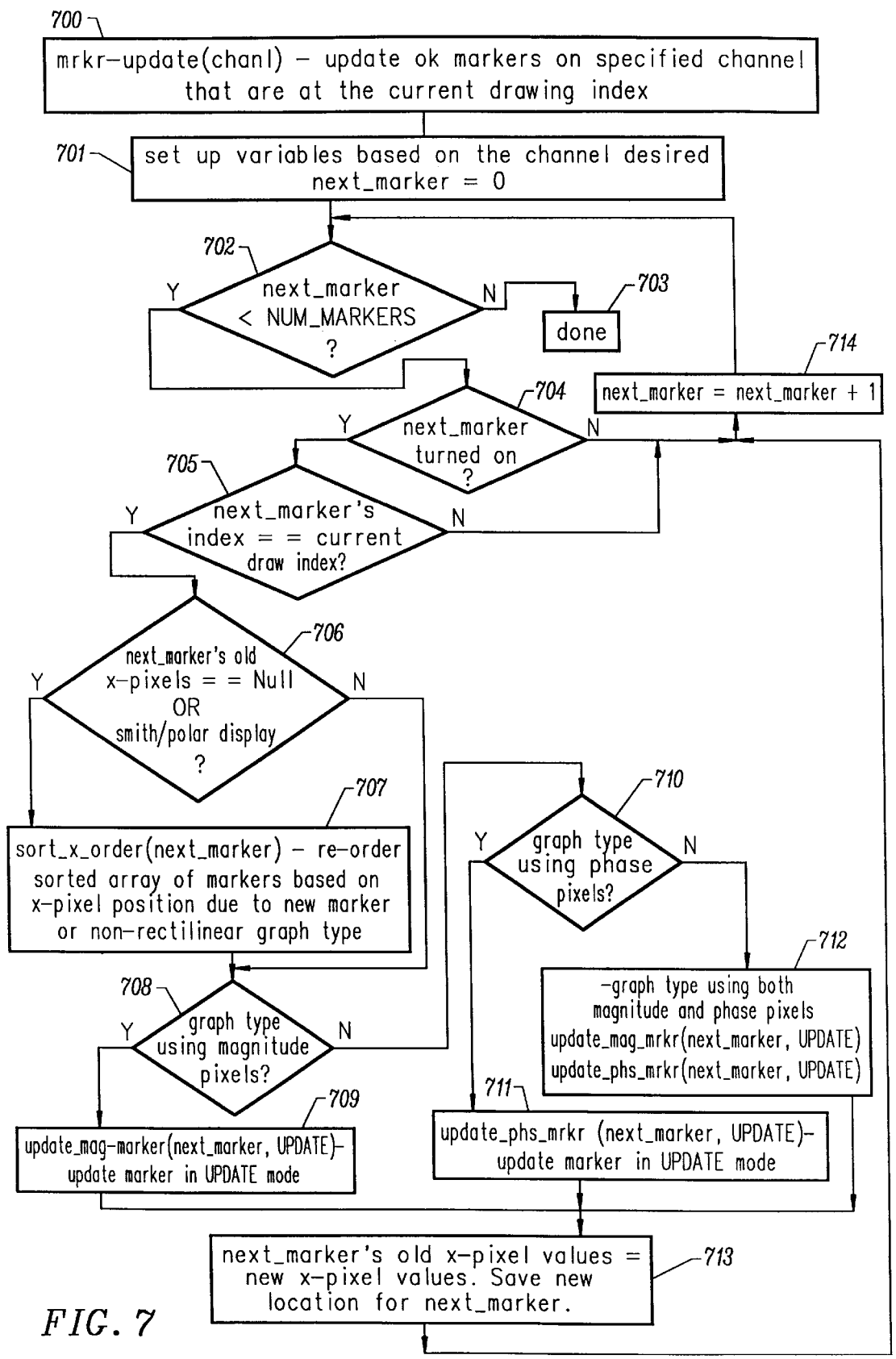
FIG. 7 illustrates the control routine for updating markers.

FIG. 7 illustrates the mrkr_update (chanl) routine by which all markers on a specified channel are updated in the order in which they appear on the trace automatically, during each new sweep of data samples. This routine begins at block 700 by calling the subroutine. The next step involves setting up variables based on the channel desired and setting a variable next_marker equal to zero. The variables set up based on the channel desired are the boundaries of the graph field for the channel, the type of graph and other information pertinent to the positioning markers on the channel.

Next, the routine determines whether the next_marker value is less than the NUM-MARKERS, which is a value indicating the number of markers on the display (block 702). If this value is greater than or equal to the NUM-MARKERS value, the algorithm is done (block 703). If the next-marker value is less than the NUM-MARKERS value, the algorithm branches to block 704 where it is determined whether the marker having the number of next marker is turned on. If that marker is turned on, the algorithm branches to block 705 where it is determined whether the next_marker's index equals the current drawing index. This determines whether the next_marker lies on the data sample being updated.

If the index is equal to the current drawing index, the algorithm branches to block 706 where it tests to determine whether the next_marker's old x-pixel value is equal to NULL or if a Smith or polar display is being used. If either case is true, the algorithm sort-x-order (next_marker) is called in block 707. This algorithm reorders a sorted array of marker numbers based on the x-pixel position of the markers. This reordering is due to the new marker or non-rectilinear graph type determined from block 706. After reordering in block 707, or if the test of block 706 is false, the algorithm branches to block 708 where it is determined whether the graph type is using magnitude pixel arrays for one of the coordinate axes. If magnitude pixel arrays are being used, the update_mag_mrkr(next_marker, UPDATE) routine is called to update the marker in the update mode (block 709). If the graph type is not using just magnitude pixels, the algorithm branches to block 710 where it is determined whether the graph type uses just phase pixel arrays. If phase pixel arrays are used, the update-phs-mrkr (next-marker, UPDATE) routine is called to update the marker in the update mode (block 711). If the graph type does not use just phase pixel arrays, it is determined that the graph type uses both magnitude and phase pixels and both the update_mag_mrkr and update_phs_mrkr routines are called in the update mode (block 712).

From blocks 709, 711 or 712, the algorithm branches to block 713 where the new location for next_marker is saved. From block 713, from block 705 if the next_marker's index is not at the current drawing index, or from block 704 if the next_marker is not turned on, the algorithm branches to block 714 where the next_marker value is incremented. Finally, the algorithm loops to block 702 to repeat for all of the markers on the display.

FIG. 8 illustrates the move_mrkr (marker_num, all_chanls) routine by which the marker having number marker_num is moved to a new position on all channels, if flag all_chanls is true, or if the flag all_chanls is false, only channels with the same domain as the active channels (block 800). The first step is to determine whether all channels have been analyzed by the routine (block 801). If all channels have not been analyzed, it is determined whether this channel must be done based on the all_chanls flag (block 802). If the current channel is to be updated, the variables are set up for this channel based on the graph type and other parameters (block 803). Next, it is determined whether the data sample for the marker_num falls within the sweep range of the current channel in block 804. If it does not fall within the sweep range, the marker_num's old x-pixels value is set to NULL to signify that it is not in the range (block 805). If it falls within the sweep range, the algorithm branches to block 806 where the sort-x-order (marker-num) algorithm is called to re-order the sorted array of markers based on marker_num's new x-pixel position. After re-ordering the sorted array of markers, it is determined whether the current marker is turned on (block 807). If the current marker is turned on, it is determined whether the graph type uses magnitude pixels (block 808). If magnitude pixels are being used, the update_mag_mrkr(marker_num, MOVE) is called to update the marker in the MOVE mode (block 809). If the graph type does not use magnitude pixels, it is determined whether it uses phase pixels in block 810. If phase pixels are being used, the update_phs_mrkr routine is called in the MOVE mode (block 811). If the tests in blocks 808 and 810 fail, the graph type uses both magnitude and phase pixels and the update_mag_mrkr and update_phs_mrkr routines are called in the MOVE mode (block 812). From blocks 809, 811 and 812, the algorithm branches to block 813 where the marker_num's old x-pixel values are set to the new values, saving the new location for marker_num. Then the algorithm branches back to block 801 to determine whether more channels need to be updated. If more channels do not need to be updated, the algorithm branches to block 814 where it is determined whether the marker_num is equal to the active marker. If it is, the variable old active marker is set to the active marker value (block 815). From block 815 or block 814, if active marker does not equal marker_num, the algorithm branches to the done block (816).

Figure 9:
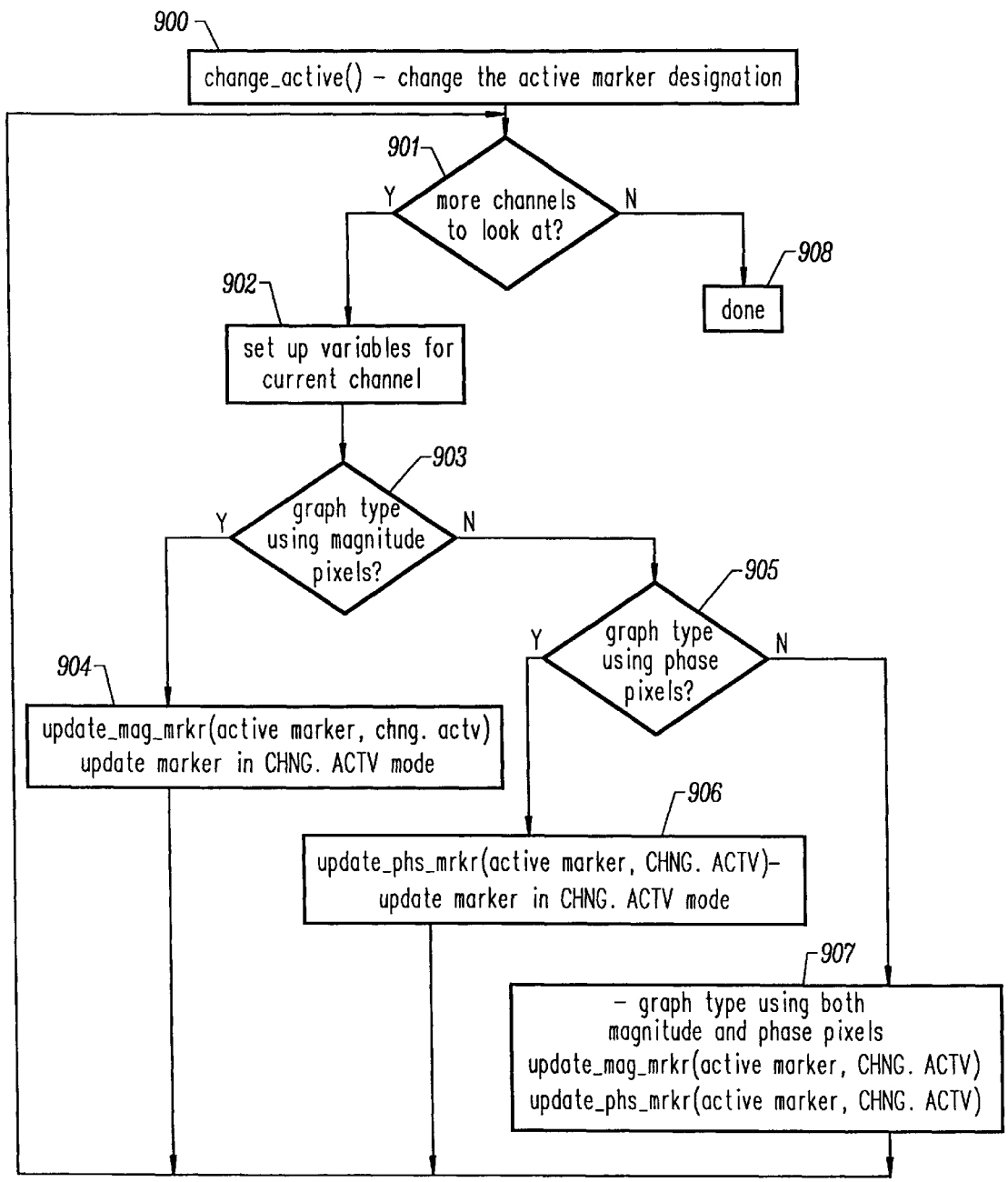
FIG. 9 illustrates the control routine for changing the active marker designation.

FIG. 9 illustrates the change_active( ) routine which changes the active marker designation. This algorithm begins in block 900 with calling the routine. The first step determines whether more channels need to be updated (block 901). If more channels need to be updated, the variables are set up for the current channel (block 902). If the graph type uses magnitude pixels as determined in block 903, the update_mag_mrkr routine is called for the active marker in the CHNG_ACTV mode (block 904). If the graph type does not use magnitude pixels in the tests of block 903, it is determined whether it is a graph-type using phase pixel arrays (block 905). If phase pixel arrays are used, the update phs mrkr routine is called in the CHNG_ACTV mode (block 906). If the graph type uses neither magnitude nor phase pixel arrays based on the tests in blocks 903 and 905, the graph type uses both magnitude and phase pixel arrays and the update_mag_mrkr and update_phs_mrkr routines are called in the CHNG_ACTV mode (block 907). From block 904, 906 or 907, the algorithm branches to block 901. If in block 901, no more channels need to be reviewed, the algorithm is done (block 908).

Figure 10:
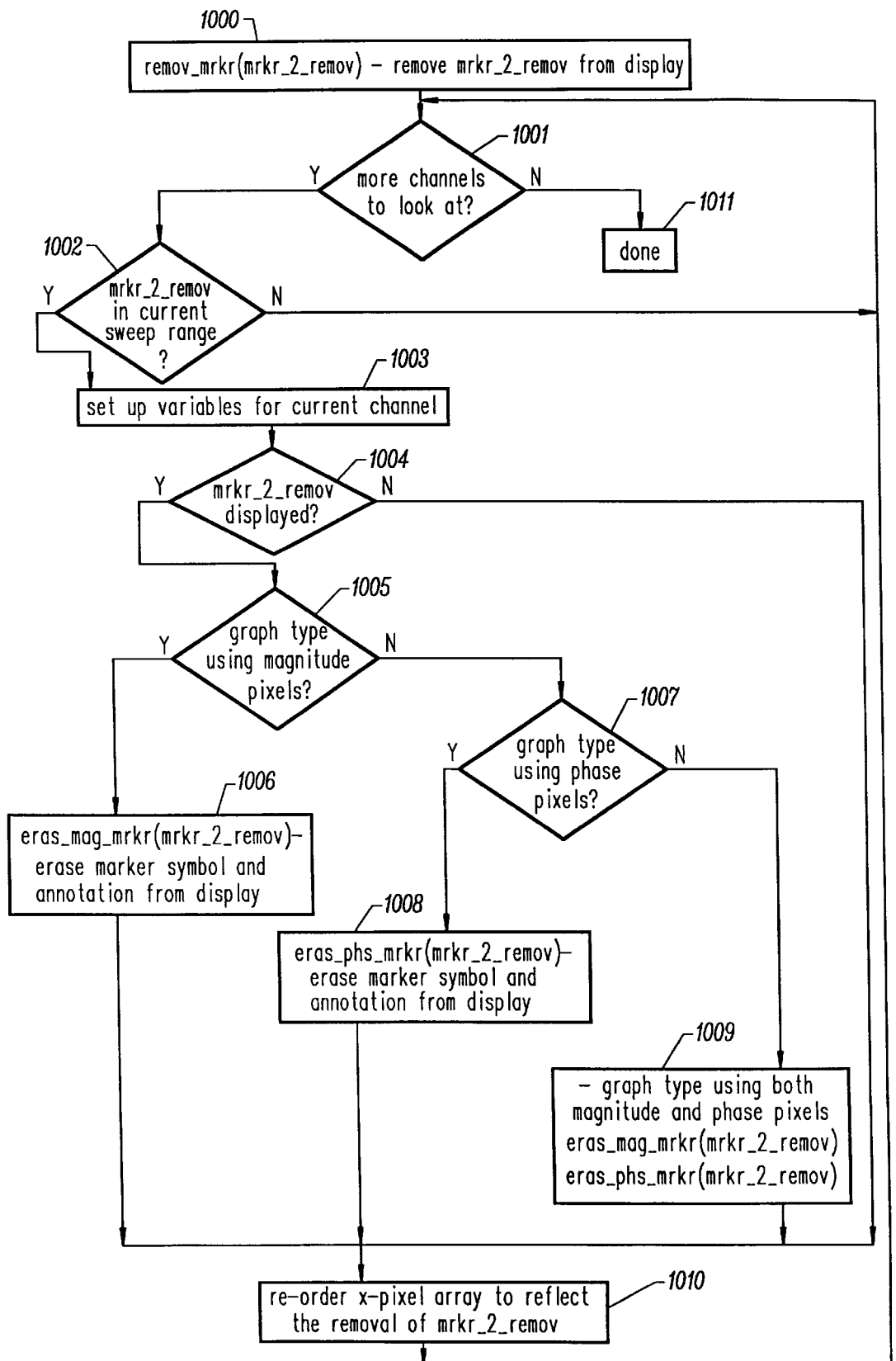
FIG. 10 illustrates the control routine for removing a marker from the display.

FIG. 10 illustrates the remov_mrkr routine for the variable mrkr_2_remov which results in removing the mrkr_2_remov from the display. This algorithm begins in block 1000 by calling the routine. The first step determines whether more channels need to be reviewed (block 1001). If more channels need updating, it is determined whether mrkr_2_remov is in the current sweep range in block 1002. If it falls within the current sweep range, the variables are set up for the current channel (block 1003). Next, it is determined whether mrkr_2_remov is on the display (block 1004). If it is on the display, it is determined whether the graph type is using magnitude pixels (block 1005). If magnitude pixels are being used, the eras_mag_mrkr routine is called to erase the 1Q marker symbol and annotation fields from the display (block 1006). If the graph does not use only magnitude pixel arrays, it is determined whether it uses only phase pixel arrays in block 1007. If it uses only phase pixel arrays, the eras_phs_mrkr routine is called to erase the symbol and annotation fields from the display for the mrkr_2_remov (block 1008). If the graph does not use only phase pixel arrays in the tests in block 1007, the graph uses both magnitude and phase pixel arrays and both eras_mag_mrkr and eras_phs_mrkr are called (block 1009). From blocks 1006, 1008 or 1009, the algorithm branches to block 1010 where the array of marker numbers that are sorted according to x-pixel value is re-ordered to reflect the removal of mrkr_2_remov.

The algorithm also branches from block 1004 to block 1010 if the mrkr_2_remov is not on the display. From block 1010 the algorithm branches to block 1001 to determine whether there are more channels to update.

If there are not, then the algorithm is done (block 1011).

Figure 11A:
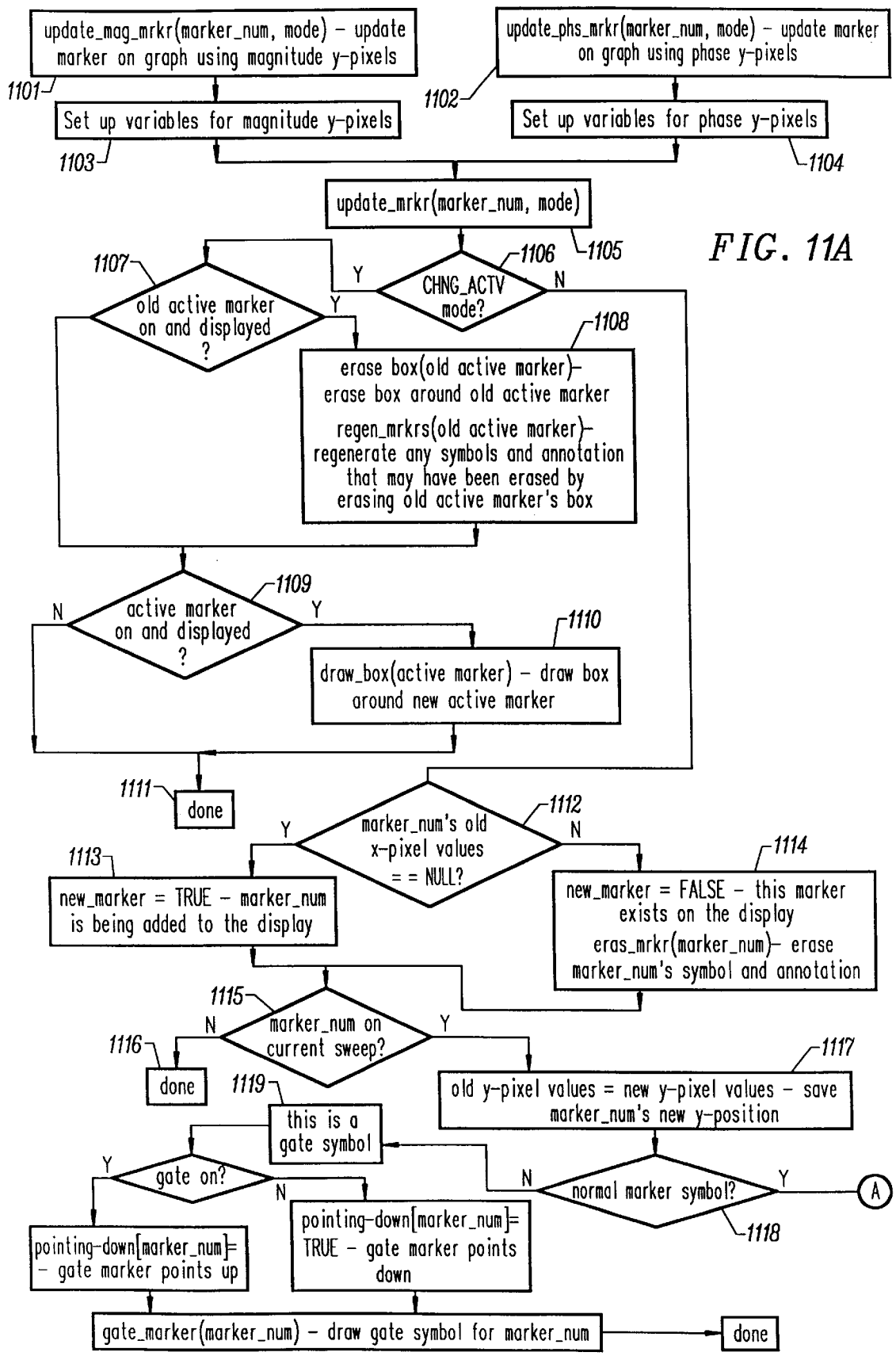
FIGS. 11A and 11B illustrate the routine for updating a marker display on a graph.
Figure 11B:
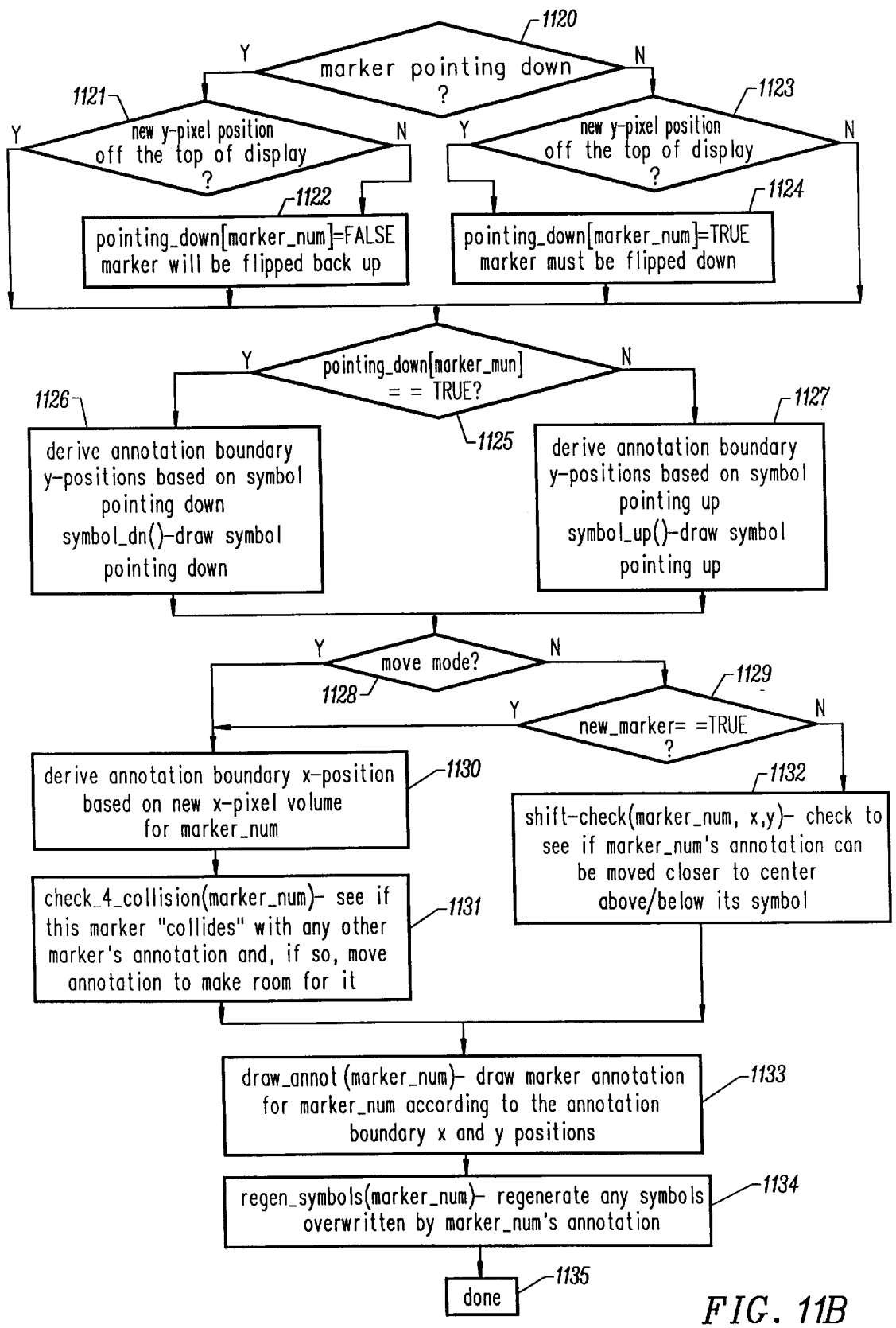

FIGS. 11A and 11B illustrate the update_mag_mrkr and update_phs_mrkr routines according to the preferred embodiment. These algorithms are basically the same except that the update_mag_mrkr routine is called in block 1101 and the update_phs-mrkr is called in block 1102. From block 1101, the variables are set up for magnitude y-pixels in block 1103. From block 1102, the variables are set up for phase y-pixels in block 1104.

From blocks 1103 and 1104, the algorithms merge to the update_mrkr routine with variables (marker_num, mode) (block 1105). First it is determined whether it is the CHNG-ACTV mode in block 1106. If it is, it is determined whether the old active marker is on and displayed in block 1107. If it is, then the box indicating active marker is erased and the regen_mrkrs routine is called for the old active marker to regenerate any symbol and annotations that may have been erased by erasing the box (block 1108). If the old active marker is not on and displayed from block 1107, or after block 1108, the algorithm branches to block 1109 where it is determined whether the active marker which is indicated by the marker_num variable, is on the display. If it is, a box is drawn around the active marker by the draw_box routine (block 1110). If the active marker is not on and displayed from block 1109 or after block 1110, the algorithm branches to block 1111 where it is done for the CHNG_ACTV mode.

If it is not in the CHNG_ACTV mode in the test in block 1106, the algorithm determines whether the marker_num's old x-pixel value is equal to NULL in block 1112. If the old x-pixel value is NULL, the variable new_marker is set TRUE indicating that marker_num is being added to the display (block 1113). If the old x-pixel value is not equal to the empty set, the algorithm branches to block 1114 where the new_marker value is set FALSE and the eras_mrkr routine is called for marker_num, erasing the symbol and annotation fields.

From blocks 1113 and 1114, the algorithm branches to block 1115 where it is determined whether the marker-num is in the current sweep. If it is not, the algorithm is done (block 1116). If the marker_num is within the current sweep, the algorithm branches to block 1117 where the old y-pixels values are set to the new values to save the marker_num's new y-position. From block 1117, the algorithm tests whether a normal marker symbol is being displayed (block 1118). If it is not a normal marker symbol, then it is a gate symbol (block 1119) and the algorithm goes on to determine whether the gate marker should be pointing up and down according to a routine for displaying these gate symbols, which is not directly related to the present invention. The flowchart for this process is provided in FIG. 11A for completeness, but not further described here.

If a normal marker symbol is being displayed, the algorithm branches to the point A in FIG. 11B. From the point A, the algorithm tests whether marker_num is pointing_down on the display (that is, not pointing in the preferred orientation) in block 1120. If the marker_num is pointing_down, then it is determined whether the new y-pixel position will cause the annotation to overlap with the boundaries of the display (block 1121). If it would not overlap, the pointing_down variable for marker_num is set FALSE so that the marker will be flipped back to the preferred orientation of above the trace (block 1122). If the marker_num is not pointing down in the test of block 1120, the new y-pixel position is tested to determine whether it would cause the annotation to overlap the upper boundary of the display (block 1123). If it would, the pointing_down variable for marker_num is set TRUE so that the marker will be flipped down (block 1124). If the new y-pixel position in block 1123 is not off the top of the display, or after blocks 1124 and 1122, or if the new y-pixel position is off the top of the display in block 1121, the algorithm branches to block 1125 where the pointing_down variable is tested to determine whether it is TRUE. If it is TRUE, the annotation boundary y-positions are calculated based on the symbol pointing down and the symbol_dn( ) routine is called to draw the symbol pointing down on the display (block 1126). If the pointing down variable is FALSE, the annotation boundary's y-positions are calculated based on symbols pointing_up and the symbol is drawn pointing up (block 1127).

From blocks 1126 and 1127, the mode is tested in block 1128. If the mode is not the MOVE mode, the algorithm branches to block 1129 to determine whether the new_marker variable has been set TRUE. If the new_marker has been set TRUE or if the algorithm is in the MOVE mode from block 1128, the annotation boundary x-position based on the new x-pixel value for marker_num is calculated (block 1130). Next, the check_4_collision routine is called for marker_num to determine whether this marker collides with other markers' annotation and if so, moves their annotations to make room (block 1131). If the new marker has not been set TRUE from block 1129 and if the mode is UPDATE, the shift_check routine is called in block 1132 to determine whether marker_num's annotation can be moved closer to the center above or below its symbol. From blocks 1131 and 1132, the draw_annot routine is called for marker_num to draw the marker's annotation according to the annotation boundary x and y positions (block 1133). Next, the regen-symbols routine is called for marker_num to regenerate any symbols overwritten by the new annotation (block 1134). Finally, the algorithm is done (block 1135).

Figure 12A:
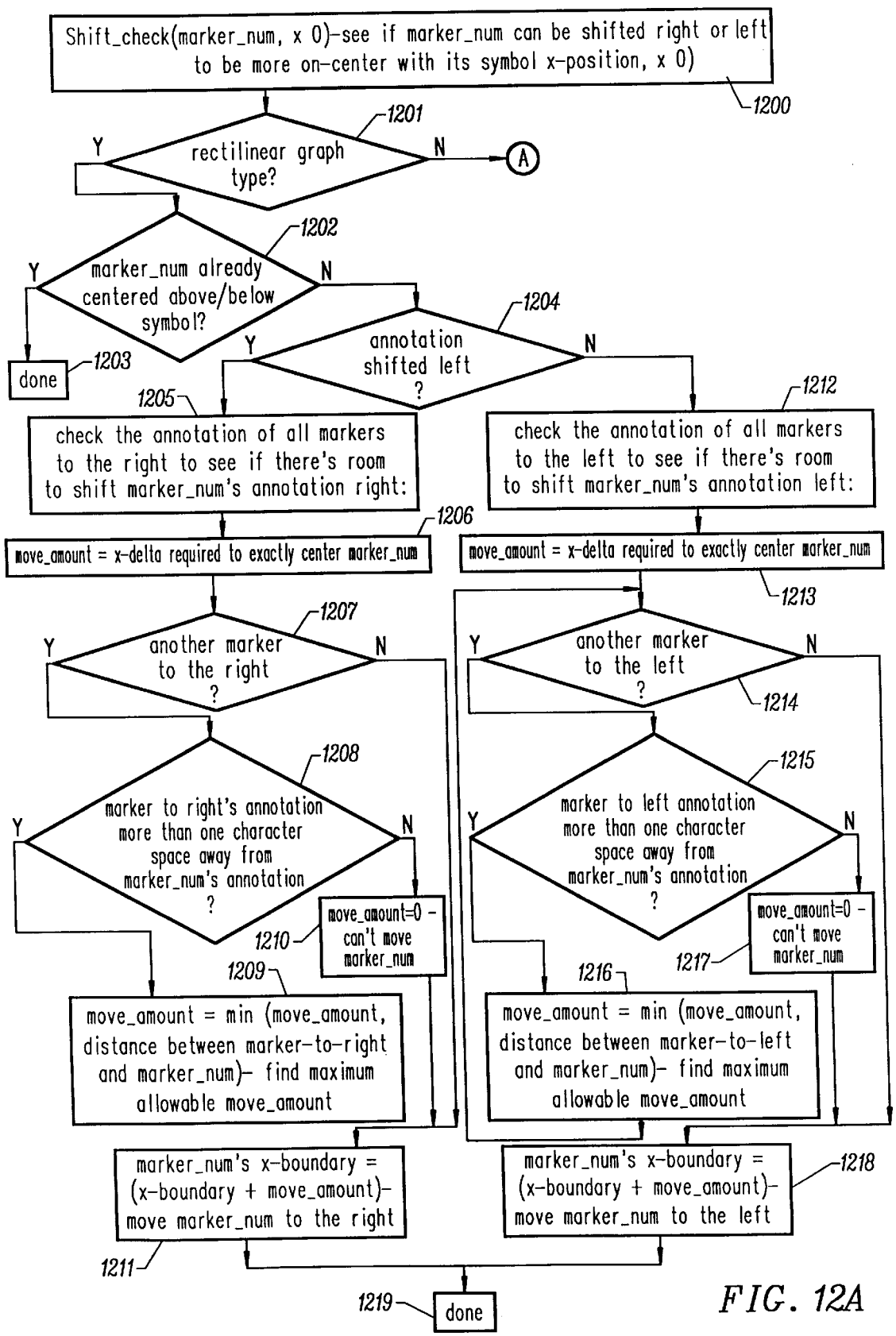
FIGS. 12A and 12B illustrate the algorithm for determining whether a marker symbol can be shifted right or left to be more on center with its data sample.
Figure 12B:
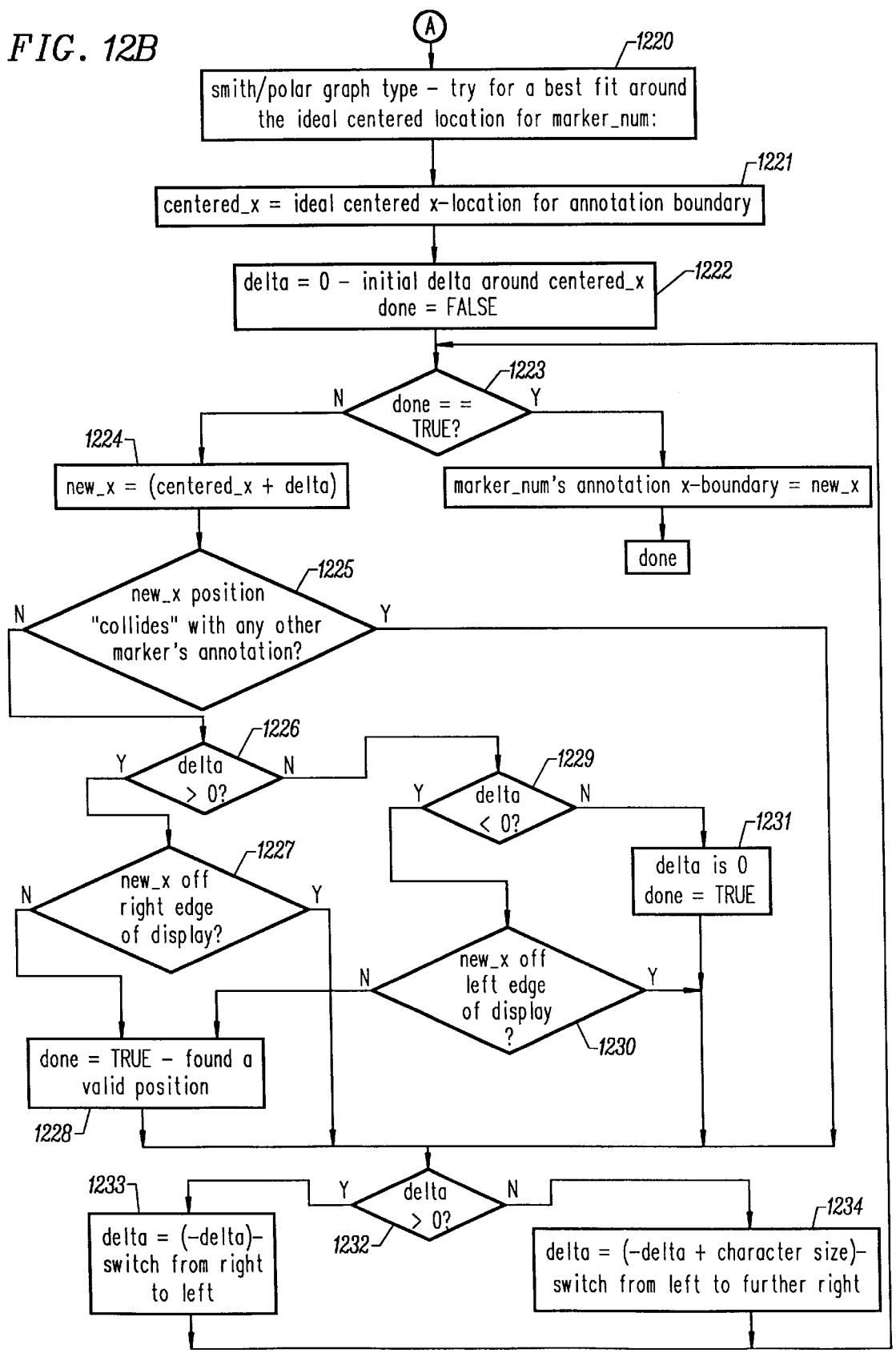

FIGS. 12A and 12B make up the shift_check algorithm for the variables marker_num and x0, where x0 is the x-position of the data sample corresponding to marker_num. This algorithm is called from block 1132 of the update routine of FIGS. 11A–11B and begins in block 1200. The first test determines whether a rectilinear graph type is being used (block 1201). If it is not being used, the algorithm branches to the point A in FIG. 12B. If a rectilinear graph type is being used, the algorithm branches to block 1202 to determine whether marker_num is already centered above or below its symbol. If it is centered, the algorithm is done (block 1203). If the marker_num is not centered, the algorithm branches to block 1204 where it is determined whether the annotation is shifted to the left with respect to the symbol, the symbol being positioned on the data sample of the respective marker. If the annotation is shifted left, the algorithm will check the annotation of all markers to the right to determine if there is room to shift marker_num's annotation right through branch to block 1205. The variable move_amount is set to the value x-delta which is the amount required to center exactly the marker_num (block 1206). Next, it is determined whether there is another marker to the right of marker_num (block 1207). If there is another marker to the right, it is determined whether the marker to the right's annotation is more than one character space away from marker_num's annotation (block 1208). If it is more than one character space away, the move_amount is set to the minimum of the current move_amount as the routine loops or the distance between the marker to the right and marker_num in order to provide the maximum allowable amount of room without overwriting (block 1209). If the marker to the right is not more than one character space away, then move_amount is set to zero (block 1210). From block 1209 the algorithm branches to block 1207 to determine whether another marker is to the right of marker_num. If there is not another marker to the right of marker_num, or after block 1210, the algorithm branches to block 1211 where the x-boundary for marker_num is set to the old x-boundary plus the move_amount, causing the marker to move to the right.

If, in block 1204, the annotation determined is not shifted to the left, the annotation of all markers to the left will be checked to determine if there is room to shift marker_num to the left through a branch to (block 1212). Move_amount is set to x-delta which is the amount required to center exactly the marker_num over its symbol (block 1213). Next, it is determined if another marker exists to the left of marker_num (block 1214). If there is another marker to the left, its annotation is tested to determine whether it is more than one character space away from marker num (block 1215). If it is more than one character space, the move_amount is set to the minimum of the current move_amount as the routine loops or the distance between the marker to the left and marker_num to provide the maximum allowable amount of movement to the left (block 1216). From block 1216, the algorithm branches to block 1214. If in block 1215, the marker to the left's annotation is not more than one character space away from the marker_num's annotation, the move_amount is set to zero (block 1217). From block 1217, or if there are no more markers to the left in block 1214, then marker_num's x-boundary is set to its old x-boundary minus the move_amount to shift marker_num to the left (block 1218). From blocks 1211 or 1218, the algorithm branches to done (block 1219).

In block 1201, if it is determined that a non-rectilinear graph is being used, the algorithm branches to point A in FIG. 12B. At this point, it is determined that a Smith or polar graph type is being used and the method tries for best fit around the ideal center location for marker_num (block 1220). The value centered_x is calculated indicating the ideal centered x-location for the annotation boundary of marker_num (block 1221). Next, delta is set equal to zero so the centered_x will be tried initially, and the variable done is set FALSE (block 1222). From there, the algorithm tests the done variable in block 1223. If done is not TRUE, the variable new_x is set equal to centered_x+ delta (block 1224). Next, it is determined whether the new_x position collides with any other marker's annotation (block 1225). If there is no collision, it is determined whether delta is greater than zero (block 1226). If it is greater than zero, it is determined whether new_x is off the right edge of the display (block 1227). If it is not off the right edge of the display, then the variable done is set TRUE, indicating that a valid position has been found (block 1228). If, in block 1226, it is determined that delta is less than or equal to zero, then it is determined whether delta is less than zero in block 1229. If delta is less than zero, it is determined whether new__x is off the left edge of the display in block 1230. If it is not off the left edge of the display, the algorithm branches to block 1228. If delta is not less than zero, then delta is equal to zero and done is set TRUE (block 1231). From block 1228, if new__x is off the right edge of the display from block 1227, if new__x is off the left edge of the display from block 1230, from block 1231, or if the new x-position collides with another marker's position, then the algorithm branches to block 1232.

In block 1232 it is determined whether delta is greater than zero. If it is greater than zero, then delta is set equal to the opposite of delta, which switches delta from the right to the left side of centered__x (block 1233). If delta is not greater than zero in the test of block 1232, delta is set equal to minus delta plus the character size, switching delta from left of centered__x to an increment further to the right of centered__x (block 1234). From blocks 1233 or 1234, the algorithm branches to block 1223 and the loop continues until done is set TRUE after a valid position is found.

Figure 13A:
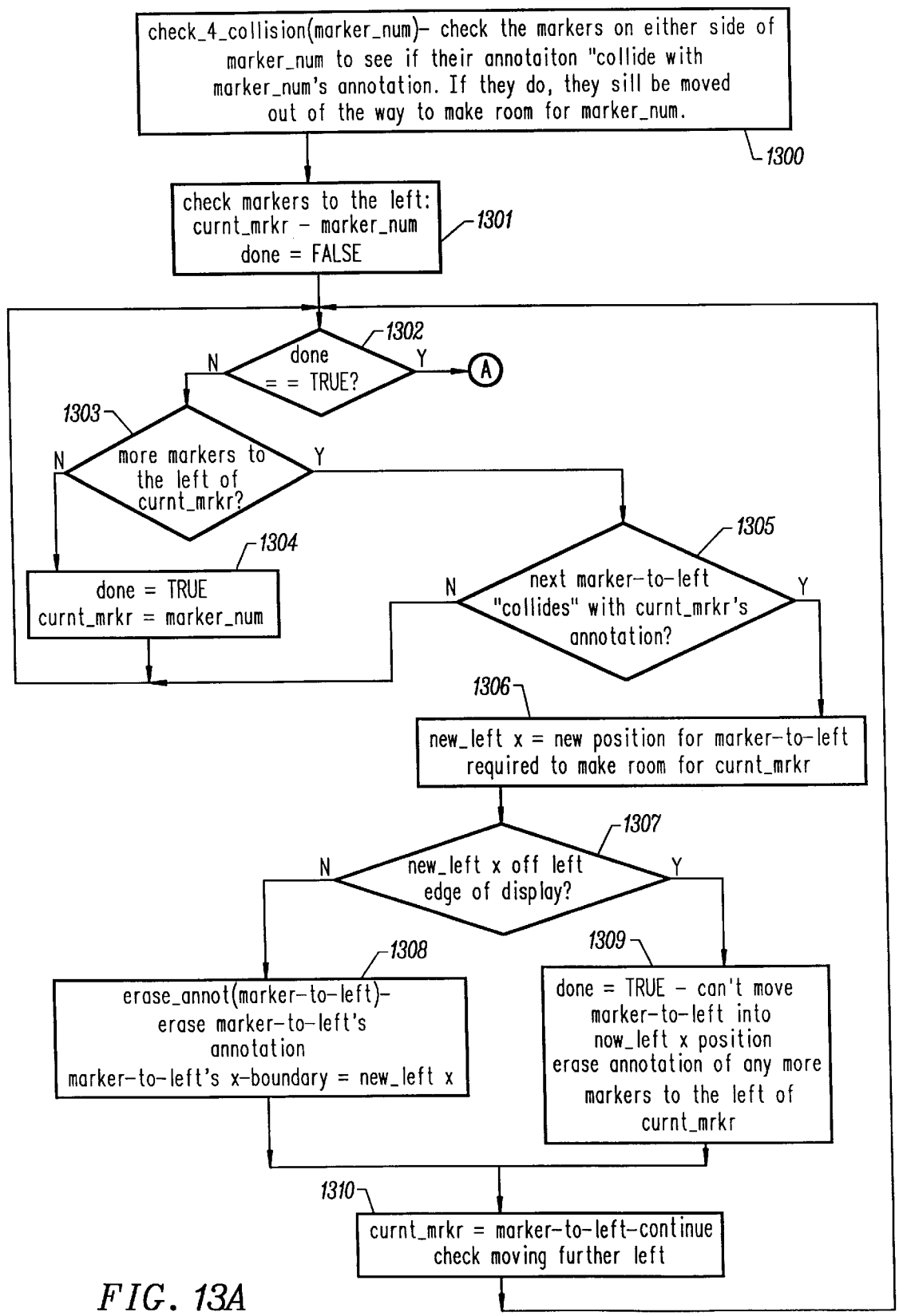
FIG. 13A and 13B is the algorithm for determining whether the annotation symbol of a marker collides with annotations of other markers, and for moving the overlapping markers out of the way to make room for the current marker.
Figure 13B:
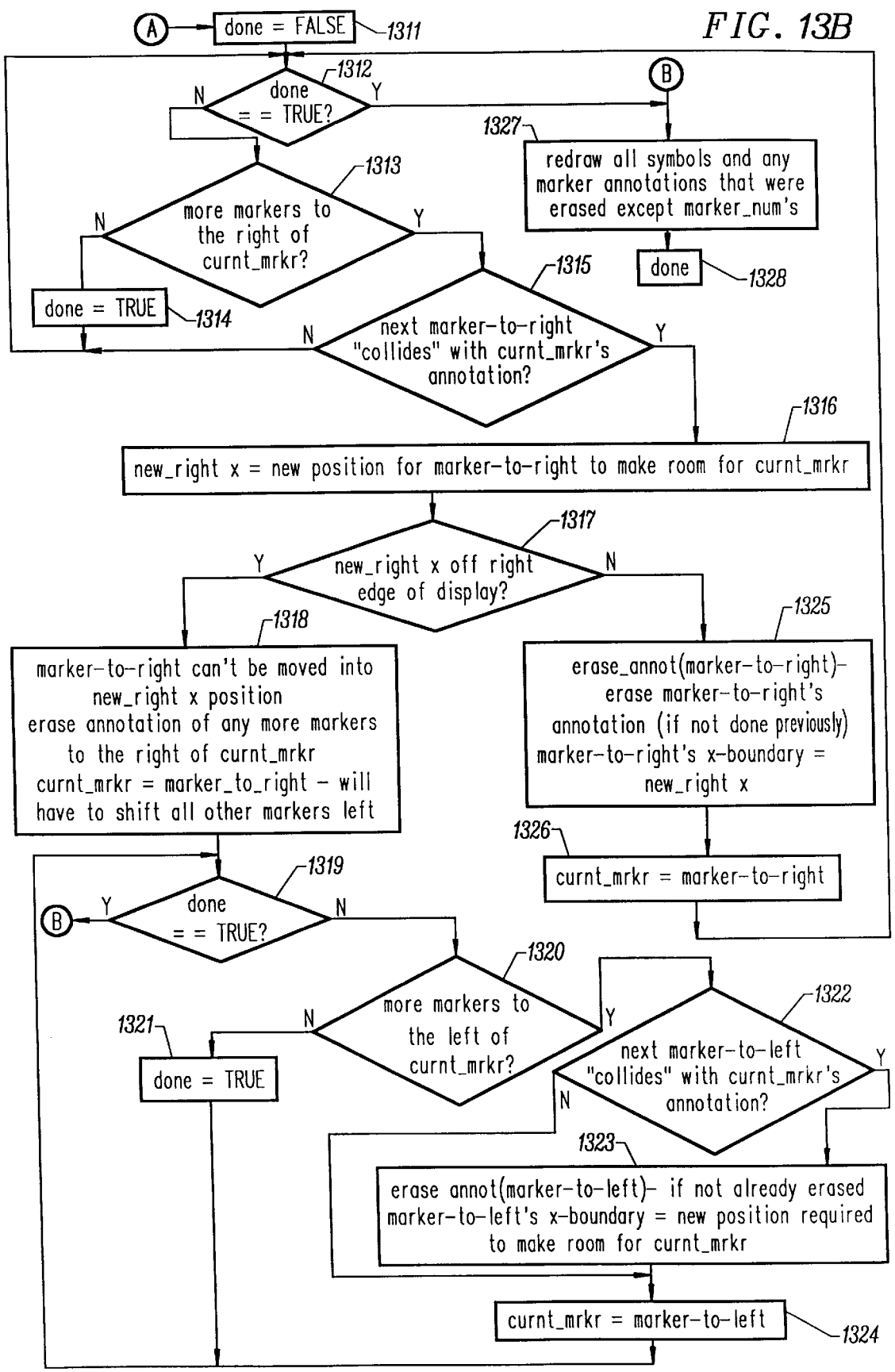

FIGS. 13A and 13B illustrate the check__4__collision algorithm with a variable marker__num called from block 1131 of the update routine of FIGS. 11A–11B. This algorithm checks for markers on either side of marker__num to determine whether their annotations "collide" with marker__num's annotation. If they do, they will be moved out of the way to make room for marker__num. This algorithm begins in block 1300. The first step involves checking markers to the left of marker__num. Variable curnt__mrkr is set to marker__num, and variable done is set to FALSE (block 1301). Next, the done variable is tested in block 1302. If done is FALSE, it is determined whether there are more markers to the left of curnt__mrkr (block 1303). If there are no more markers to the left, done is set TRUE and curnt__mrkr is set to marker__num (block 1304). If there are more markers to the left, the algorithm determines whether the next marker to the left collides with curnt__mrkr's annotation (block 1305). If it does collide, then variable new__leftx is set to the new position for marker to the left, required to make room for curnt__mrkr (block 1306). Next, the new__leftx value is tested to determine whether it is off the left edge of the display (block 1307). If it is not, the eras__annot algorithm is called for marker__to__left to erase its annotation and the marker__to__left boundary position is set equal to the new__leftx (block 1308). If new__leftx is off the left edge of the display at block 1307, then done is set TRUE and marker__to__left cannot be moved into new__leftx position. Further, the annotations of any markers to the left of curnt__mrkr are erased (block 1309).

From blocks 1308 or 1309, the algorithm branches to block 1310 where curnt__mrkr is set equal to marker__to__left to continue checking markers moving to the left. From blocks 1310, 1304, or if the marker__to__left does not collide with curnt__mrkr annotation in block 1305, the algorithm branches to block 1302 to determine if done is TRUE. If done is TRUE, the algorithm branches to the point A in FIG. 13B where the done variable is reset to FALSE and the checking of markers to the right begins (block 1311).

Next, the algorithm tests whether done is TRUE (block 1312). If done is not TRUE, it tests whether there are more markers to the right of curnt__mrkr (block 1313). If there are no more markers to the right, done is set TRUE (block 1314). If there are more markers to the right, it is determined whether next marker__to__right collides with curnt__mrkr's annotation (block 1315). If it does collide, the variable new__rightx is set equal to the new position for marker__to__right which makes room for curnt__mrkr (block 1316). Next, it is determined whether new__rightx is off the right edge of the display (block 1317). If it is, then marker__to__right cannot be moved into its new__rightx position and the annotation of any more markers to the right of curnt__mrkr is erased. Further, curnt__mrkr is set equal to marker__to__right so that all other markers can be shifted in loops of the program (block 1318). After block 1318, the done variable is tested in block 1319. If it is FALSE, it is determined whether there are more markers to the left of curnt__mrkr (block 1320). If there are no more markers to the left, then done is set TRUE in block 1321. If there are markers to the left, it is determined whether the next marker__to__left lies within curnt__mrkr's annotation (block 1322). If it does collide, then the eras__annot algorithm is called for marker__to__left if it is not already erased and the next marker__to__left boundary is set to the new position required to make room for curnt__mrkr (block 1323). If the marker__to__left does not collide with curnt__mrkr or after block 1323, the algorithm branches to block 1324 where curnt__mrkr is set equal to marker__to__left. From block 1324 or block 1321, the algorithm branches to block 1319. If done is TRUE in block 1319, the algorithm branches to the point B in the upper right portion of FIG. 13B. Likewise, if done is TRUE in block 1312, the algorithm branches to the point B.

If, at block 1317, the new__rightx is not off the right edge of the display, the algorithm branches to block 1325 where eras__annot for marker__to__right is called if it is not already erased and marker__to__right's x-boundary is set equal to the new__rightx. Next, the curnt__mrkr variable is set equal to the marker__to__right (block 1326) and the algorithm branches to block 1312. If in block 1323, done is TRUE, the algorithm branches to the point B where all symbols are redrawn and any marker annotations that were erased, except marker__num's, are redrawn (block 1327). From there the algorithm is done (block 1328).

Figure 14:
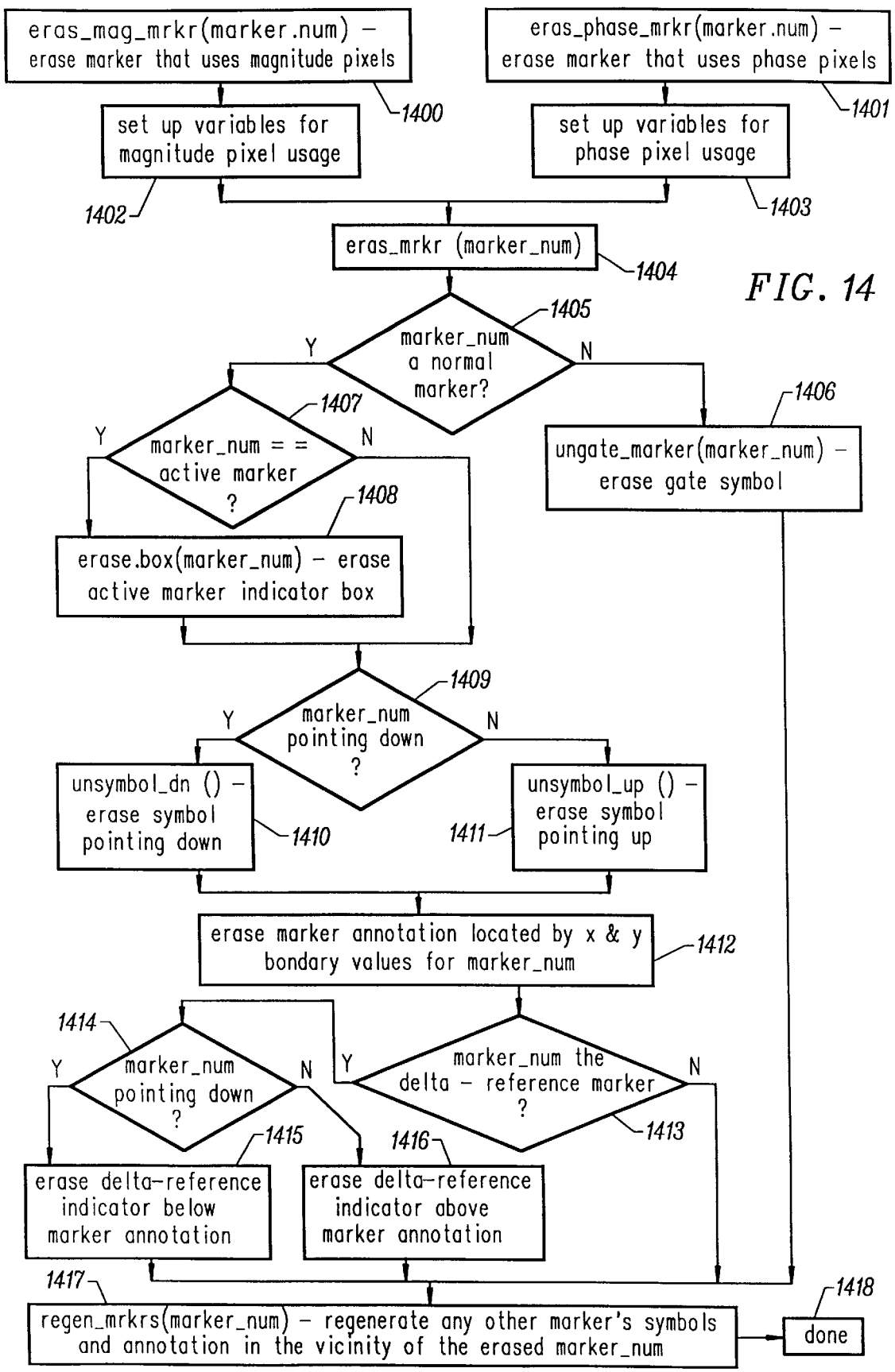
FIG. 14 illustrates the algorithm for erasing markers on the display.

FIG. 14 illustrates the eras__mag__mrkr and eras__phs__mrkr routines which erase markers using magnitude and phase pixels, respectively. The eras__mag__mrkr routine is called in block 1400 and the eras__phs__mrkr routine is called in block 1401. From block 1400, the variables are set up for magnitude pixel usage (block 1402) and from block 1401, variables are set up for phase pixel usage (block 1403). From blocks 1402 or 1403, the eras__mrkr routine is called for the variable marker__num (block 1404). First, it is determined whether marker__num is a normal marker (block 1405). If it is not normal, the algorithm ungate__marker for marker__num is called to erase the gate symbol in block 1406. Again, gates are a marker type that is not displayed according to the present invention, but is included here for completeness. From block 1405, if it is a normal marker, it is determined whether the marker__num is the active marker (block 1407). If it is, the active marker indicator box is erased (block 1408). From block 1408, if marker__num is not the active marker, the algorithm branches to block 1409, where it is determined whether the annotation for marker__num is pointing down. If it is pointing down, the symbol pointing down is erased (block 1410). If it is pointing up, the symbol pointing up is erased (block 1411). From block 1410 or 1411, the marker annotation field located by the x and y boundary values for marker__num is erased (block 1412). From block 1412, it is determined whether marker__num is the delta__reference marker, for which the annotation includes a delta reference indicator (block 1413). From block 1413, if it is a delta_reference marker, it is determined whether marker_num is pointing down in block 1414. If it is pointing down, the delta_reference indicator below the marker annotation is erased (block 1415). If it is not pointing down, the delta_reference indicator above the marker annotation is erased (block 1416). From block 1415, block 1416, block 1413 if marker_num is not the delta_reference marker as indicated, or from block 1406, the algorithm branches to block 1417 where the regen_mrkrs algorithm is called for marker_num to regenerate any other marker's symbols and annotation in the vicinity of the erased marker_num. From block 1417, the algorithm is done (block 1418).

Figure 15:
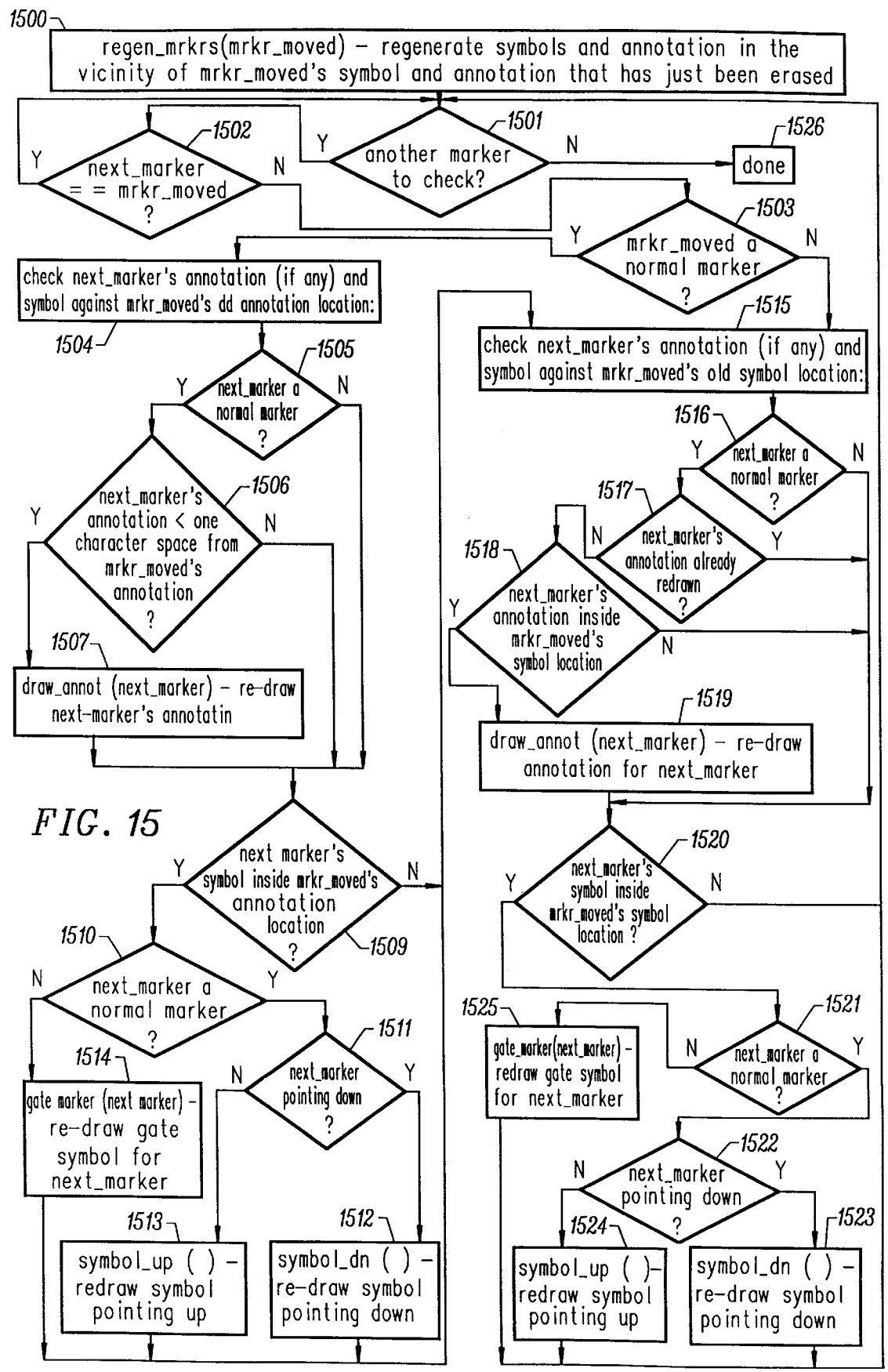
FIG. 15 illustrates the algorithm for regenerating symbols and annotation in the vicinity of an erased marker.

FIG. 15 illustrates the regen_mrkrs routine which regenerates symbols and annotations in the vicinity of a moved marker's symbol and annotation which has just been erased. This algorithm is called in block 1500.

From block 1500, the algorithm determines whether another marker is left to check in the regen_mrkr's routine (block 1501). This is accomplished by going through the ordered array of markers one by one until all markers are checked. The next_marker in the ordered array is then checked to determine if it is equal to the mrkr_moved (block 1502). If it is, the algorithm branches up to block 1501. If it is not, the algorithm branches to block 1503 where it is determined whether mrkr_moved is a normal marker. If it is a normal marker, the algorithm branches to block 1504 where the annotation (if any) and symbol for the next_marker will be checked against the mrkr_moved old annotation location (block 1504). It is determined whether next_marker is a normal marker (block 1505). If it is a normal number, it is determined whether next_marker's annotation is less than one character space from mrkr_moved's annotation (block 1506). If it is less than one character space, the draw_annot routine for next_marker is called to re-draw the next_marker's annotation (block 1507). From block 1505, if next_marker is not a normal marker, or from block 1506, if next_marker's annotation is not less than one character space from mrkr_moved, the algorithm branches to block 1509 where it is determined whether the next_marker's symbol lies inside mrkr_moved's annotation (block 1509). If it does lie within the annotation location, the algorithm determines whether next-marker is a normal marker (block 1510). If it is normal, it is determined whether next-marker is pointing down (block 1511). if next_marker is pointing down, the symbol is redrawn pointing down (block 1512). If next_marker is pointing up, the marker is redrawn pointing up (block 1513). If from block 1510, next_marker is not a normal marker, the gate marker is redrawn for the next_marker (block 1514). From block 1514 and 1513, 1512 or if next_marker's symbol is not inside the annotation location from block 1509, the algorithm will check the annotation, if any, and symbol against mrkr_moved's old symbol location (block 1515).

Also, if mrkr_moved is not a normal marker from block 1503, the algorithm branches to block 1515. In block 1515, the algorithm branches to a routine where the annotation (if any), and the symbol of next_marker are checked against mrkr_moved's old symbol location beginning at block 1515. This routine begins with block 1516 where it determines whether the next marker is a normal marker. If it is, it is determined whether the next_marker's annotation has already been redrawn (block 1517). If it has not already been redrawn, it is determined whether next_marker's annotation is inside mrkr_moved's symbol location (block 1518). If it is within the symbol location, the annotation is redrawn for next_marker (block 1519). If next_marker is not a normal marker from block 1516, next_marker's annotation had already been redrawn in 1517, next_marker's annotation was not inside the mrkr_moved's symbol location, or after block 1519, the algorithm goes to block 1520 where it is determined whether the next_marker symbol lies inside mrkr_moved's symbol location. If it does, it is determined whether next_marker is a normal marker (block 1521). If it is normal, it is determined whether next_marker is pointing down (block 1522). If next_marker is pointing down, the symbol is redrawn pointing down (block 1523). If next_marker is pointing up, the symbol is re-drawn pointing up (block 1524). If, from block 1521, it is determined whether next_marker is not a normal marker, the gate symbol is redrawn for the next marker (block 1525). From blocks 1525, 1524, 1523 or if next_marker's symbol is not inside the mrkr_moved's symbol location in block 1520, the algorithm branches to block 1501. If there are no more markers to check, the algorithm is done (block 1526).

Figure 16:
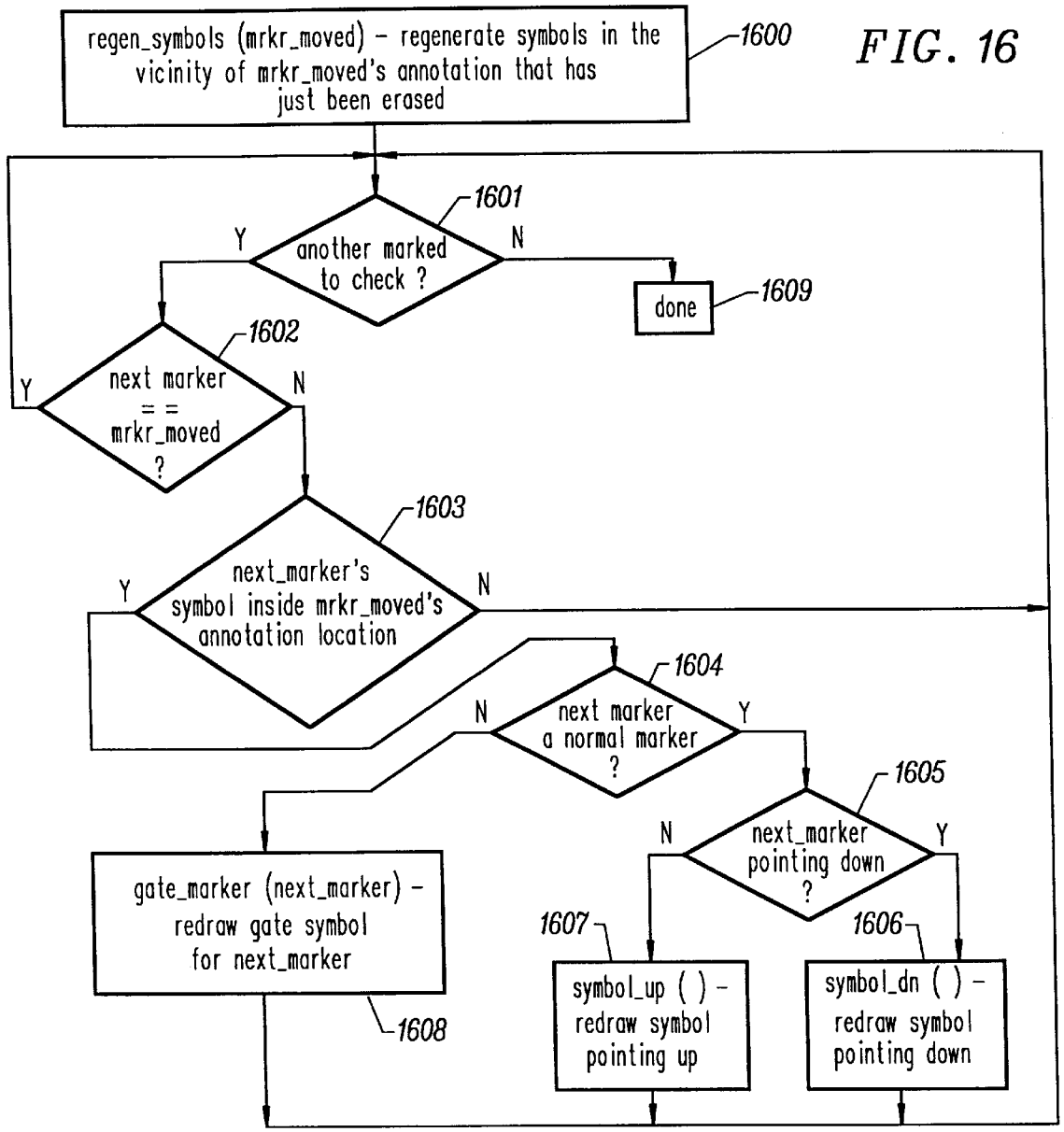
FIG. 16 illustrates the algorithm for regenerating symbols on the graph in the vicinity of an erased marker.

FIG. 16 illustrates the regen_symbols subroutine for mrkr_moved which is called in block 1600. This subroutine regenerates symbols in the vicinity of mrkr_moved's annotation that has just been erased. The first step involves determining whether another marker is on the display to be checked, by reviewing the ordered array of marker numbers (block 1601). If there is another marker to be checked, it is determined whether next_marker is equal to mrkr_moved (block 1602). If it is, the algorithm branches back to block 1601. If it is not, the algorithm determines whether next_marker's symbol lies inside the mrkr_moved's annotation location (block 1603). If it does lie within the annotation location, it is determined whether next_marker is a normal marker (block 1604). If it is a normal marker, it is determined whether next_marker is pointing down (block 1605). If it is pointing down, the symbol is redrawn pointing down (block 1606). If it is pointing up from block 1605, the symbol is redrawn pointing up (block 1607). If next_marker is not a normal marker from block 1604, the gate symbol is redrawn (block 1608). From blocks 1608, 1607, 1606, or if next_marker's symbol is not inside the mrkr_moved annotation location at block 1603, the algorithm branches to block 1601 and continues until there are no markers to check, at which point it branches to done (block 1609).

Figure 17:
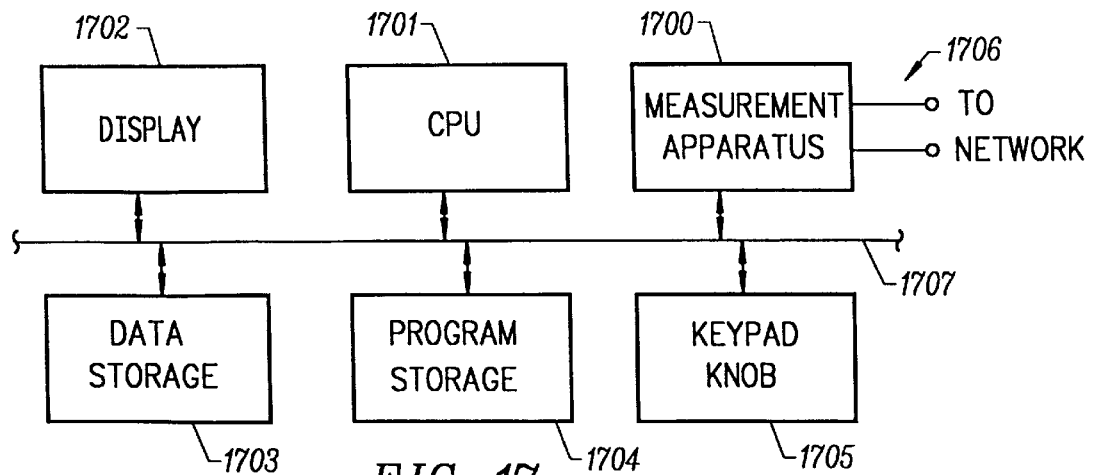
FIG. 17 is a block diagram of an apparatus according to the present invention.

FIG. 17 is a block diagram of a network analyzer system, such as the WILTRON 360 Network Analyzer, described in more detail in the cross-referenced U.S. Patent application entitled MICROWAVE MEASUREMENT SYSTEM AND ASSOCIATED METHOD, identified above. The network analyzer illustrated in FIG. 17 is an apparatus for displaying data according to the methods described above.

The network analyzer includes a measurement apparatus 1700, a central processing unit 1701, a display system 1702, data storage 1703, program storage 1704 and a user-input such as a keypad and a knob 1705. The measurement apparatus is coupled to a network across terminals 1706. Each of the elements of the network analyzer illustrated in FIG. 17 communicate electronically as illustrated by bus 1707.

The apparatus according to the present invention is implemented with a CPU 1701, operating under control of software stored in program storage 1704. The measurement apparatus 1700 collects data samples and stores them in data storage 1703. The CPU 1701 under control of software in program storage 1704 manipulates the data from data storage 1703 for display in the display system 1702. The display system 1702 in the preferred embodiment is a bit map video display system as discussed above. Of course, other display systems such as vector display systems can be used with appropriate modifications to the software algorithms.

Although the preferred embodiment is implemented using a general purpose CPU 1701 controlled with software modules in the program storage 1704, equivalent systems can be implemented with unique hardware modules using dedicated circuitry, microcode-controlled processors, or a plurality of dedicated CPUs as is well known in the art.

Accordingly, each of the functional software modules described above, in combination with the CPU, comprise apparatus for performing the functions outlined in the software. According to one aspect, the present invention is an apparatus for positioning markers on the graph field of a display screen for use with a network analyzer system that includes elements performing the software-defined functions.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

We claim:

1. For use with a data processing system including a display, the display displaying a graph of data samples in a graph field on the display, the graph including a first coordinate axis, a second coordinate axis and a trace indicating characteristics of data samples with respect to the coordinate axes, and further including a plurality of markers indicating positions of respective data samples along the trace, each marker having a marker annotation for display, a method for positioning the plurality of markers on the graph field, comprising:
    calculating positions of the marker annotations of the plurality of markers according to a preferred orientation with respect to the trace;
    identifying markers for which the marker annotation according to the calculated position, lies in whole or in part outside the graph field; and
    recalculating the position of each identified marker according to a second orientation with respect to the trace.

2. The method of claim 1, wherein the graph field has an upper boundary on the display, the preferred orientation provides for the marker annotations to be positioned above the trace, and the step of identifying markers includes:
    determining whether the marker annotation of each marker according to the first calculated position, lies in whole or in part above the upper boundary of the graph field.

3. The method of claim 2, wherein the second orientation provides for the marker annotation to be positioned below the trace.

4. The method of claim 1, further including the step of displaying the markers in a first color, the trace in a second color and indicators of the coordinate axes in a third color.

5. The method of claim 4, wherein the graph includes a stored trace in addition to the trace, and the stored trace is displayed in a color different from the second color.

6. For use with a data processing system including a display, the display displaying a graph of data samples in a graph field on the display, the graph including a first coordinate axis, a second coordinate axis and a trace indicating characteristics of data samples with respect to the coordinate axes, and further including a plurality of markers indicating positions of respective data samples along the trace, each marker having a marker annotation for display, a method for displaying the plurality of markers, comprising:
    calculating a position for a marker annotation for a first marker according to a preferred orientation with respect to the trace and its respective data samples;
    identifying markers in the plurality of markers which have marker annotation that overlaps with annotation of the first marker according to the calculated position; and
    recalculating the position of each identified marker so that the marker annotation of the identified marker no longer overlaps with the marker annotation of the first marker.

7. For use with a data processing system including a display, the display displaying a graph of data samples in a graph field on the display, the graph including a first coordinate axis, a second coordinate axis and a trace indicating characteristics of data samples with respect to the corrdinate axes, and further including a plurality of markers indicating positions of respective data samples along the trace, each marker having a marker annotation for display, a method for positioning a first marker in the plurality of markers, comprising:
    calculating the position of the marker annotation for the first marker according to a preferred orientation with respect to the trace and its data sample;
    determining whether the marker annotation of the first marker according to the preferred orientation, lies in whole or in part outside the graph field;
    if it is determined that the marker annotation of the first marker lies in whole or in part outside the graph field, then recalculating the position of the annotation of the first marker according to a second orientation with respect to the trace;
    identifying markers which have marker annotation that overlaps with the marker field according to the calculated or first recalculated position; and
    recalculating the position of each identified marker so that the marker annotation of the identified marker no longer overlaps with the marker annotation of first marker.

8. For use with a data processing system including a display, the display displaying a graph of data samples in a graph field on the display, the graph including a first coordinate axis, a second coordinate axis and a trace indicating characteristics of data samples with respect to the coordinate axes, and further including a plurality of markers indicating positions of respective assigned data samples along the trace, each marker having a marker annotation for display, a method for displaying the plurality of markers wherein a new marker is added for an assigned data sample on the trace, comprising:
    calculating a position of a marker field for the new marker according to a preferred orientation with respect to the trace and its assigned data sample;
    identifying markers for which the marker annotation that overlaps with the marker field of the new marker according to the calculating position; and
    recalculating a position for each identified marker so that the marker annotation of the identified marker no longer overlaps with the marker annotation of the new marker.

9. For use with a data processing system including a display, the display displaying a graph of data samples in a graph field on the display, the graph including a first coordinate axis, a second coordinate axis and a trace indicating characteristics of data samples with respect to the coordinate axes, and further including a plurality of markers indicating positions of respective assigned data samples along the trace, each marker having a marker annotation for display, a method for displaying the plurality of markers wherein one of the plurality of markers is moved by changing its assigned data sample, comprising:

- calculating a position of a marker annotation for the moved marker according to a preferred orientation with respect to the trace and its assigned data sample;
- identifying markers for which the marker annotation overlaps with the marker annotation of moved marker according to the calculated position; and
- recalculating a position for each identified marker so that the marker annotation of the identified marker no longer overlaps with the marker annotation of the moved marker.

10. For use with a data processing system including a display, the display displaying a graph of data samples in a graph field on the display, the graph including a first coordinate axis, a second coordinate axis and a trace indicating characteristics of data samples with respect to the coordinate axes, and further including a plurality of markers indicating positions of respective assigned data samples along the trace, each marker having a marker annotation for display, a method for displaying the plurality of markers wherein the trace of data samples is updated, comprising:

- identifying a marker for which the marker annotation is not in a preferred position with respect to the updated trace and its assigned data sample;
- determining a direction and distance for the identified marker in which the marker field should be shifted to reach the preferred position;
- finding a shift distance to the marker annotation of any other marker lying less than the determined distance away from the identified marker in the determined direction; and
- shifting the marker annotation of the identified marker the lesser of the shift distance or the determined distance.

11. For use with a data processing system including a display, the display displaying a graph of data samples in a graph field on the display, the graph including a first coordinate axis, a second coordinate axis and a trace indicating characteristics of data samples with respect to the coordinate axes, and further including a plurality of markers indicating positions of respective data samples along the trace, each marker having a marker annotation for display, an apparatus for positioning the plurality of markers on the graph field, comprising:

- means for calculating positions of the marker annotations of the plurality of markers according to a preferred orientation with respect to the trace;
- means for identifying markers for which the marker annotation according to the calculated position, lies in whole or in part outside the graph field; and
- means for recalculating the position of each identified marker according to a second orientation with respect to the trace.

12. The apparatus of claim 11, wherein the graph field has an upper boundary on the display, the preferred orientation provides for the marker annotations to be positioned above the trace, and the means for identifying markers includes:

- means for determining whether the marker annotation of each marker according to the first calculated position, lies in whole or in part above the upper boundary of the graph field.

13. The apparatus of claim 12, wherein the second orientation provides for the marker annotation to be positioned below the trace.

14. The apparatus of claim 11, further including the means for displaying the markers in a first color, the trace in a second color and indicators of the coordinate axes in a third color.

15. The apparatus of claim 14, wherein the graph includes a stored trace in addition to the trace, and the stored trace is displayed in a color different from the second color.

16. For use with a data processing system including a display, the display displaying a graph of data samples in a graph field on the display, the graph including a first coordinate axis, a second coordinate axis and a trace indicating characteristics of data samples with respect to the coordinate axes, and further including a plurality of markers indicating positions of respective data samples along the trace, each marker having a marker annotation for display, an apparatus for displaying the plurality of markers, comprising:

- means for calculating a position for a marker annotation for a first marker according to a preferred orientation with respect to the trace and its respective data samples;
- means for identifying markers in the plurality of markers which have marker annotation that overlaps with annotation of the first marker according to the calculated position; and
- means for recalculating the position of each identified marker so that the marker annotation of the identified marker no longer overlaps with the marker annotation of the first marker.

* * * * *